US012644914B2

(12) United States Patent (10) Patent No.: US 12,644,914 B2
Glover et al. (45) Date of Patent: Jun. 2, 2026

(54) RADIO ASSEMBLY COMPRISING REMOVABLE COMPONENTS AND METHOD FOR ASSEMBLY

(71) Applicant: Telefonaktiebolaget LM Ericsson (publ), Stockholm (SE)

(72) Inventors: Richard Glover, Ottawa (CA); Michael Moy, Carleton Place (CA); Irfan Khan, Nepean (CA); Francis Marion, Gatineau (CA)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 0 days.

(21) Appl. No.: 19/123,280

(22) PCT Filed: Nov. 4, 2022

(86) PCT No.: PCT/IB2022/060649

§ 371 (c)(1),
(2) Date: Apr. 22, 2025

(87) PCT Pub. No.: WO2024/095048

PCT Pub. Date: May 10, 2024

(65) Prior Publication Data

US 2026/0009831 A1 Jan. 8, 2026

(51) Int. Cl.
G01R 29/08 (2006.01)
H01Q 1/22 (2006.01)
(52) U.S. Cl.
CPC .......... G01R 29/0878 (2013.01); H01Q 1/22 (2013.01)
(58) Field of Classification Search
None
See application file for complete search history.

(56) References Cited

U.S. PATENT DOCUMENTS 8,378,915 B2 * 2/2013 Arvidsson .............. H01Q 1/246
343/837
2022/0407240 A1 * 12/2022 Bisiules ................ H01Q 1/246

FOREIGN PATENT DOCUMENTS

KR 101085890 B1 * 11/2011 .............. H01Q 3/06
KR 1020210151698 A 12/2021
WO 2022224014 A1 10/2022

OTHER PUBLICATIONS

International Search Report and Written Opinion dated Jun. 21, 2023 for International Application No. PCT/IB2022/060649 filed Nov. 4, 2022; consisting of 9 pages.

* cited by examiner

*Primary Examiner* — Richard Isla
(74) *Attorney, Agent, or Firm* — Weisberg I.P. Law, P.A.

(57) ABSTRACT

A method, system and assembly are disclosed. A radio assembly includes at least one radio including a radio board, a plurality of filter units, a plurality of clamp elements, and an antenna unit. A subset of the plurality of filter units remain removably attached to the radio board while the remaining plurality of filter units remain removably attached to the antenna unit and plurality of clamp elements based on whether the second plurality of fastening elements are unfastened from a subset of the plurality of second filter mating elements associated with the subset of the plurality of filter units, the third plurality of fastening elements associated with the subset of the plurality of filter units are unfastened from respective first filter mating elements; and the first plurality of fastening elements associated with the remaining plurality of filter units are unfastened from respective radio mating elements.

15 Claims, 17 Drawing Sheets

RADIO ASSEMBLY COMPRISING REMOVABLE COMPONENTS AND METHOD FOR ASSEMBLY

CROSS-REFERENCE TO RELATED APPLICATION

This application is a Submission Under 35 U.S.C. § 371 for U.S. National Stage Patent Application of International Application Number: PCT/IB2022/060649, filed Nov. 4, 2022 entitled "RADIO ASSEMBLY REPAIRABILITY," the entirety of which is incorporated herein by reference.

TECHNICAL FIELD

The present disclosure relates to radio antenna assemblies and in particular, to a radio assembly that provides, for example, selective detachment of individual filter units.

BACKGROUND

The Third Generation Partnership Project (3GPP) has developed and is developing standards for Fourth Generation (4G) (also referred to as Long Term Evolution (LTE)), Fifth Generation (5G) (also referred to as New Radio (NR)) wireless communication systems and Sixth Generation (6G). Such systems provide, among other features, broadband communication between network nodes, such as base stations, and mobile wireless devices (WD), as well as communication between network nodes and between WDs.

Some of these systems use Antenna Integrated Radio (AIR) products that have typically been built using a common architecture involving three main functional blocks: Radio Board, Filters and Antenna.

These elements/functional blocks are connected to one another using bullet connectors. For example, the radio board is connected to the filters using bullet connectors and the filters are connected to the antenna using bullet connectors. Generally, there are multiple branches (e.g., antenna branches), each requiring a receive and a transmit bullet connector for each frequency between radio and filter. Between the filter and antenna, there is a bullet connector for each branch and for each frequency.

In one existing system, the AIR 3283 system has 16 antenna branches with a dedicated filter unit for each branch. Each filter has four bullet connectors between radio and filter and two bullet connectors between filter and antenna. This results in 64 bullet connectors between radio and filters and 32 bullet connectors between filters and antenna. The end result is a total of 96 bullet connectors in the system. However, with a large amount of bullet connectors, testing, reconfiguring and retesting can become troublesome in these existing systems.

In particular, existing systems such as previous AIR systems have experienced low first pass production yield caused by inline passive intermodulation (PIM) generated in the bullet connectors that make radio frequency (RF) connections between the antenna and the filters. In particular, the connection between the filter and antenna is very susceptible to PIM. This combined with blind mating of various (e.g., 32) simultaneous connections between the antenna and filter means that there is a high probability of PIM failure on one or more of these connections.

One method of correcting this problem is to identify the individual antenna branch that is generating PIM and to replace the faulty connector or clean the faulty connection. These existing AIR systems require the total disassembly of the antenna and therefore disconnection of all bullet connectors of all antenna branches, i.e., disconnecting all antenna branches from all filters. For example, the repair procedure may require removal of the entire antenna to gain access to the faulty connections or to the filter.

Subsequent reassembly of the antenna onto the radio frequently corrects the faulty antenna branch but may reveal a new fault in one of the other branches that were previously meeting inline PIM criterion/criteria (e.g., PIM under a predefined threshold). That is, there is a high risk that a previously good connection could fail upon re-connection. For example, while the filter/radio interface/connection is not too PIM sensitive, the antenna/filter interface/connection is very PIM sensitive such that reconnecting the antenna to the filter may introduce dirt, misalignment, etc. which may cause inline PIM criterion/criteria to no longer be met. That is, a good antenna branch that meets inline PIM criterion/criteria tends to stay good as long as it is not disassembled, but once disassembled and then reassembled, the antenna branch can go bad, i.e., fail to meet the inline PIM criterion/criteria. This new fault then requires another disassembly, bullet replacement and reassembly of the system which may lead to another faulty branch.

This assembly, testing and reassembly results in poor first and second pass yield in production and often requires 3-4 cycles of disassembly and reassembly to obtain a system that meets the inline PIM criterion/criteria. Further, increases in the number of antenna branches in newer systems has caused lower first pass yields as the recurrence of assembly, testing and reassembly can be higher. Hence, larger or higher capacity AIR systems can suffer from more issues during the early assembly and testing phase.

SUMMARY

Some embodiments advantageously provide methods, systems, and apparatuses for selective detachment of individual filter units during, for example, assembly and testing. Further, one or more embodiments advantageously allows access to RF interconnection connectors for cleaning and/or replacement (Bullets).

The present disclosure involves attaching all of the filter units together into one structural element. Since filter units are attached to the antenna, this permits removal of the filter-antenna assembly with one lift while maintaining the connections between filter units and antenna. The filter unit to filter unit attachment mechanism allows selective detachment of individual filter units. Detachment of selective filter units permits access to replace bad bullet connectors without disconnecting the good branches (e.g., good connection between filter unit and antenna).

According to one or more embodiments, a radio assembly is provided. The radio assembly includes at least one radio including a radio board where the radio board includes a plurality of radio mating elements extending from a first side of the radio board. The radio assembly includes a plurality of filter units, each filter unit including: a first filter mating element at a first side of the filter unit, and at least one extended portion extending from a second side of the filter unit where each extended portion defines a filter via and a second filter mating element, and where the plurality of filter units are removably attached to the radio board by mating a first plurality fastening element through the plurality of filter vias and to the plurality of radio mating elements. The radio assembly includes a plurality of clamp elements where each of the plurality of clamp elements defines a plurality of clamp vias and a plurality of retaining elements where the plurality of clamp elements are removably attached to the plurality of filter units by mating a second plurality of fastening elements through the plurality of clamp vias and to the plurality of second filter mating elements. The radio assembly includes an antenna unit defining a plurality of antenna vias, the antenna unit being removably attached to the plurality of filter units by mating a third plurality of fastening elements through the plurality of antenna vias and to the first filter mating elements, and a subset of the plurality of filter units remaining removably attached to the radio board while the remaining plurality of filter units remain removably attached to the antenna unit and plurality of clamp elements based on whether: the second plurality of fastening elements are unfastened from a subset of the plurality of second filter mating elements associated with the subset of the plurality of filter units; the third plurality of fastening elements associated with the subset of the plurality of filter units are unfastened from respective first filter mating elements; and the first plurality of fastening elements associated with the remaining plurality of filter units are unfastened from respective radio mating elements.

According to one or more embodiments, each of the plurality of retaining elements is configured to retain a respective one of the first plurality of fastening elements after the respective one of the first plurality of fastening elements is unfastened from the respective radio mating element.

According to one or more embodiments, the retaining element defines a snap-fit element that is configured to snap-fit onto a portion of the respective one of the first plurality of fastening elements based on the respective one of the first plurality of fastening elements being unfastened from the respective radio mating element.

According to one or more embodiments, the snap-fit element extends through the clamp element.

According to one or more embodiments, each clamp element includes a second plurality of retaining elements, each of the second plurality of retaining elements: being positioned over a respective clamp via; and including a snap-fit portion positioned on one side of the clamp element.

According to one or more embodiments, each second filter mating element is a threaded blind hole.

According to one or more embodiments, each second filter mating element extends in an axial direction of one of the threaded blind hole and threaded through hole; and each filter via extending in the same axial direction as of the axial direction of the filter mating element.

According to one or more embodiments, each of a first subset of the plurality of clamp elements define a first number clamp vias and a first number of retaining elements; and each of a second subset of the plurality of clamp elements: define a second number clamp vias and a second number of retaining elements greater than the first number clamp vias and the first number of retaining elements; and retain a greater number of filter units than each of the first subset of the plurality of clamp elements when the plurality of clamp elements are removably attached to the filter units.

According to one or more embodiments, the antenna unit includes a plurality of first alignment protrusions extending from a first side of the antenna unit where the radio board defines a plurality of coarse alignment vias configured to receive the plurality of first alignment protrusions of the antenna unit.

According to one or more embodiments, the antenna unit includes a plurality of second alignment protrusions extending from the first side of the antenna unit where each of the second alignment protrusions defining a blind hole, and where the radio board includes a plurality of alignment pins, each of the plurality of alignment pins configured to mate with a respective blind hole of the plurality of second alignment protrusions.

According to one or more embodiments, each of the plurality of filter units includes an alignment shaft extending from the first side of the filter unit, and where the antenna unit defines a plurality of slots, each of the plurality of slots configured to receive a respective alignment shaft of a filter unit.

According to one or more embodiments, the antenna unit defines a plurality of access vias that provide access to the first plurality of fasteners where the second plurality of fasteners and third plurality of fasteners through the antenna unit.

According to one or more embodiments, the plurality of clamp elements define a plurality of tool mating elements that are configured to mate with a plurality of lifting tools for lifting the antenna unit and the remaining of plurality of filter units while the subset of the plurality of filter units remains removably attached to the radio board, and where the plurality of access vias configured to provide access to the plurality of tool mating elements.

According to another aspect of the present disclosure, a method of configuring a radio assembly is provided. The radio assembly includes at least one radio, a plurality of filter units, a plurality of clamp elements and an antenna unit, the radio including a radio board including a plurality of radio mating elements extending from a first side of the radio board, each filter unit including a first filter mating element at a first side of the filter unit and at least one extended portion extending from a second side of the filter unit, each extended portion defining a filter via and a second filter mating element, a plurality of clamp elements, each of the plurality of clamp elements defining a plurality of clamp vias and a plurality of retaining elements, an antenna unit defining a plurality of access vias. The plurality of filter units are removably attached to the radio board by mating a first plurality fastening elements through the plurality of filter vias and to the plurality of radio mating elements. The plurality of clamp elements are removably attached to the plurality of filter units by mating a second plurality of fastening elements through the plurality of clamp vias and to the plurality of second filter mating elements. The antenna unit is removably attached to the plurality of filter units by mating a third plurality of fastening elements through the plurality of access vias and to the first filter mating elements. A passive intermodulation, PIM, performance of respective interfaces between each of the plurality of filter units and the antenna unit is determined.

According to one or more embodiments, a determination is performed that a subset of the plurality of filter units fail to meet a PIM criterion. The subset of the plurality of filter units are detached from the antenna unit and the plurality of clamp elements by: unfastening the second plurality of fastening elements from a subset of the plurality of second filter mating elements associated with the subset of the plurality of filter units; and unfastening the third plurality of fastening elements associated with the subset of the plurality of filter units from respective first filter mating elements. The remaining of the plurality of filter units are detached from the radio board by unfastening the first plurality of fastening elements associated with the remining plurality of filter units from respective radio mating elements. The antenna unit is removed from the radio assembly where the remaining plurality of filter units remain removably attached to the antenna unit and the plurality of clamp elements while the subset of filter units remains removably attached to the radio board. The subset of filter units are replaced with other filter units while maintaining the PIM performance of respective interfaces between each of the remaining plurality of filter units and the antenna unit.

BRIEF DESCRIPTION OF THE DRAWINGS

A more complete understanding of the present embodiments, and the attendant advantages and features thereof, will be more readily understood by reference to the following detailed description when considered in conjunction with the accompanying drawings wherein.

DETAILED DESCRIPTION

Figure 1:
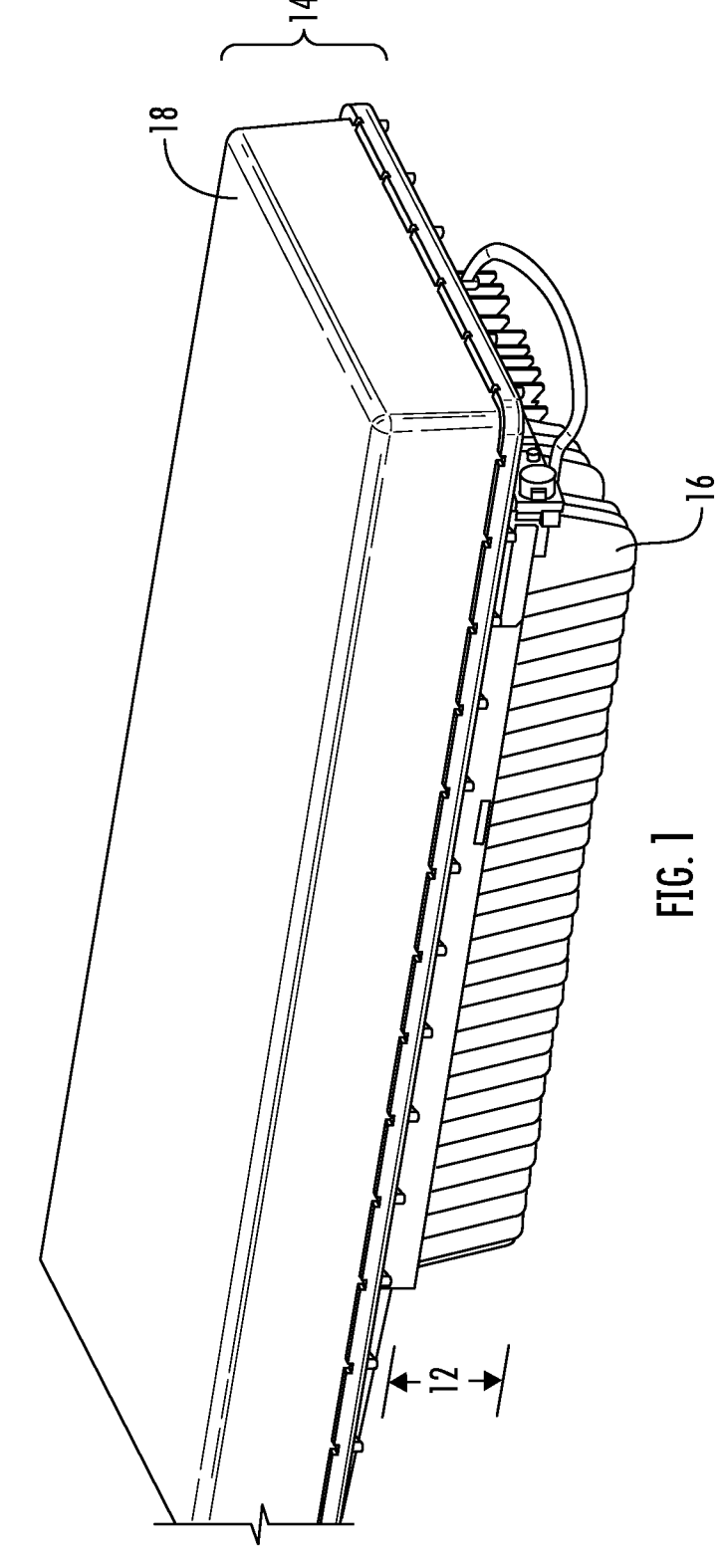
FIG. 1 is diagram of a perspective view of a portion of a radio assembly in accordance with the principles of the present disclosure.

As described above, existing radio antenna systems suffer from various issues, such as, for example, during testing and reassembly. One or more embodiments described herein solves one or more of these issues by, for example, attaching all of the filters together into one structural element. Since filters are attached to the antenna, this permits removal of the filter-antenna assembly with one lift while maintaining the connections between filter and antenna. The filter to filter attachment mechanism allows selective detachment of individual filters where the detachment of selective filters permits access to replace bad bullet connectors without disconnecting the good antenna branches. That is, a good antenna branch that meets inline PIM criterion/criteria tends to stay good as long as it is not disassembled, where one or more embodiments allows for a bad or faulty antenna branch to be repaired/removed/replaced without disassembling the good antenna branches, thereby allowing the good antenna branches to continue to meet the inline PIM criterion/criteria and retain the previous calibration.

Before describing in detail exemplary embodiments, it is noted that the embodiments reside primarily in combinations of apparatus components and processing steps related to a radio assembly that provides, for example, selective detachment of individual filter units.

Accordingly, components have been represented where appropriate by conventional symbols in the drawings, showing only those specific details that are pertinent to understanding the embodiments so as not to obscure the disclosure with details that will be readily apparent to those of ordinary skill in the art having the benefit of the description herein.

As used herein, relational terms, such as "first" and "second," "top" and "bottom," and the like, may be used solely to distinguish one entity or element from another entity or element without necessarily requiring or implying any physical or logical relationship or order between such entities or elements. The terminology used herein is for the purpose of describing particular embodiments only and is not intended to be limiting of the concepts described herein. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

In embodiments described herein, the joining term, "in communication with" and the like, may be used to indicate electrical or data communication, which may be accomplished by physical contact, induction, electromagnetic radiation, radio signaling, infrared signaling or optical signaling, for example. One having ordinary skill in the art will appreciate that multiple components may interoperate and modifications and variations are possible of achieving the electrical and data communication.

In some embodiments described herein, the term "coupled," "connected," and the like, may be used herein to indicate a connection, although not necessarily directly, and may include wired and/or wireless connections.

The terminology used herein is for the purpose of describing particular embodiments only and is not intended to be limiting of the concepts described herein. As used herein, the singular forms "a", "an" and "the" are intended to include the plural forms as well, unless the context clearly indicates otherwise. It will be further understood that the terms "comprises," "comprising." "includes" and/or "including" when used herein, specify the presence of stated features, integers, steps, operations, elements, and/or components, but do not preclude the presence or addition of one or more other features, integers, steps, operations, elements, components, and/or groups thereof.

The term "network node" used herein can be any kind of network node comprised in a radio network which may further comprise any of base station (BS), radio base station, base transceiver station (BTS), base station controller (BSC), radio network controller (RNC), g Node B (gNB), evolved Node B (eNB or eNodeB), Node B, multi-standard radio (MSR) radio node such as MSR BS, multi-cell/ multicast coordination entity (MCE), relay node, donor node controlling relay, radio access point (AP), transmission points, transmission nodes, Remote Radio Unit (RRU) Remote Radio Head (RRH), a core network node (e.g., mobile management entity (MME), self-organizing network (SON) node, a coordinating node, positioning node, MDT node, etc.), an external node (e.g., 3rd party node, a node external to the current network), nodes in distributed antenna system (DAS), a spectrum access system (SAS) node, an element management system (EMS), etc. The network node may also comprise test equipment. The term "radio node" used herein may be used to also denote a wireless device (WD) such as a wireless device (WD) or a radio network node.

In some embodiments, the non-limiting terms wireless device (WD) or a user equipment (UE) are used interchangeably. The WD herein can be any type of wireless device capable of communicating with a network node or another WD over radio signals, such as wireless device (WD). The WD may also be a radio communication device, target device, device to device (D2D) WD, machine type WD or WD capable of machine to machine communication (M2M), low-cost and/or low-complexity WD, a sensor equipped with WD, Tablet, mobile terminals, smart phone, laptop embedded equipped (LEE), laptop mounted equipment (LME), USB dongles, Customer Premises Equipment (CPE), an Internet of Things (IOT) device, or a Narrowband IoT (NB-IOT) device etc.

Also, in some embodiments the generic term "radio network node" is used. It can be any kind of a radio network node which may comprise any of base station, radio base station, base transceiver station, base station controller, network controller, RNC, evolved Node B (eNB), Node B, gNB, Multi-cell/multicast Coordination Entity (MCE), relay node, access point, radio access point, Remote Radio Unit (RRU) Remote Radio Head (RRH).

Note that although terminology from one particular wireless system, such as, for example, 3GPP LTE and/or New Radio (NR), may be used in this disclosure, this should not be seen as limiting the scope of the disclosure to only the aforementioned system. Other wireless systems, including without limitation Wide Band Code Division Multiple Access (WCDMA), Worldwide Interoperability for Microwave Access (WiMax), Ultra Mobile Broadband (UMB) and Global System for Mobile Communications (GSM), may also benefit from exploiting the ideas covered within this disclosure.

Note further, that functions described herein as being performed by a wireless device or a network node may be distributed over a plurality of wireless devices and/or network nodes. In other words, it is contemplated that the functions of the network node and wireless device described herein are not limited to performance by a single physical device and, in fact, can be distributed among several physical devices.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Some embodiments are directed to a radio assembly that provides, for example, selective detachment of individual filter units.

Referring to the drawing figures, in which like elements are referred to by like reference numerals, there is shown in FIG. 1 is a diagram of a perspective view of a portion of a radio assembly in accordance with the principles of the present disclosure. The radio assembly 10 includes a radio portion 12 (including one or more radios), an antenna and filter unit (AFU) portion 14, a heatsink 16 and a radome 18. In particular, the radio portion 12 includes at least one radio and is generally removably attached to the AFU portion 14 where the radio portion 12 may include the heatsink 16 among other components described herein. Further, the AFU portion 14 includes various components such as antennas and filter units as described herein. Further, one or more embodiments described herein provide for individual removal and replacement of a filter unit without negatively affecting the remaining filter units that may already be configured and/or calibrated, as described herein.

Figure 2:
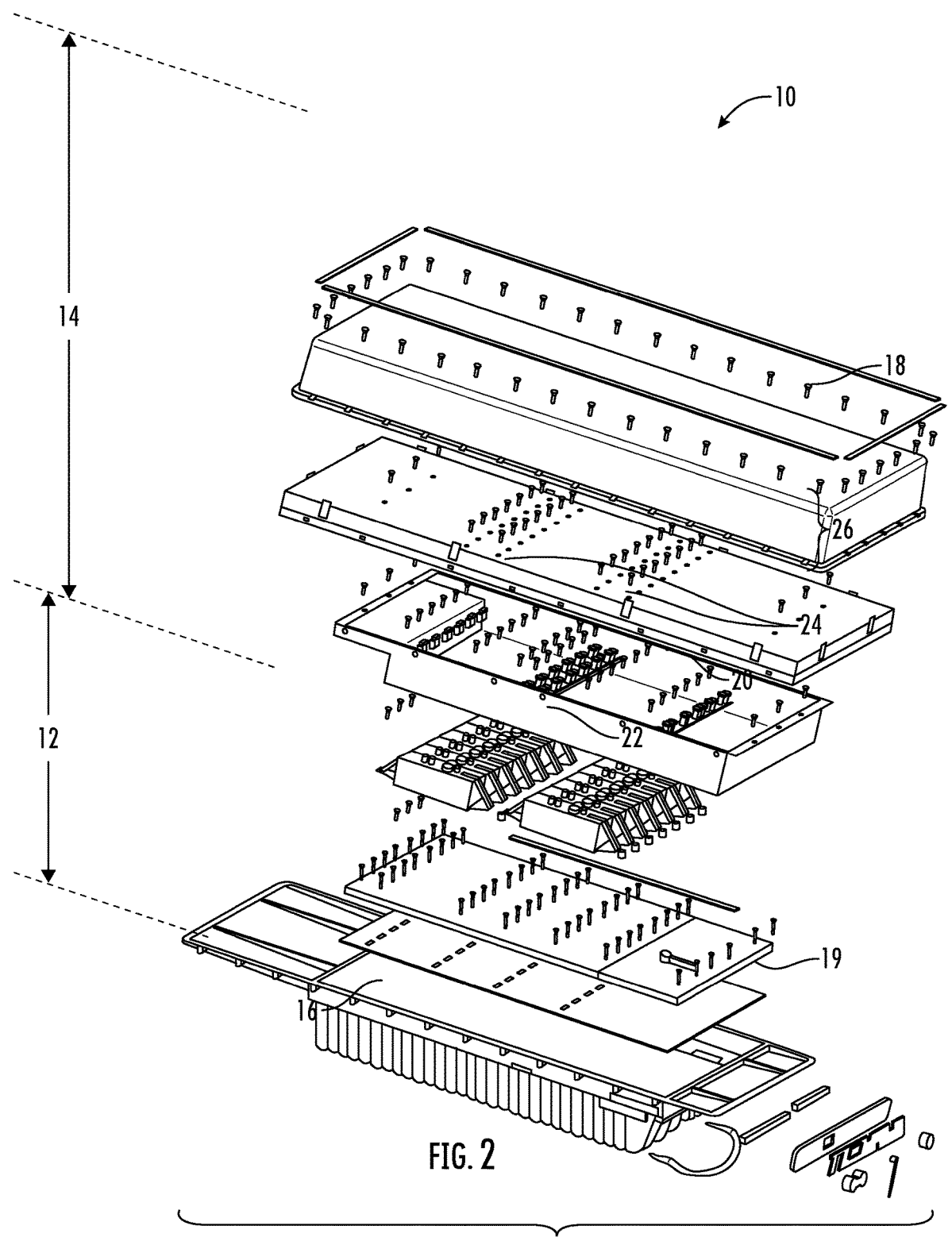
FIG. 2 is a diagram of an exploded view of the radio assembly in accordance with some embodiments of the present disclosure.

FIG. 2 is a diagram of an exploded view of the radio assembly 10 in accordance with some embodiments of the present disclosure. The radio portion 12 includes one or more radio boards 19 (collectively referred to as radio board 19) including a plurality of radio mating elements, as described below. The radio board 19 is configured to provide electrical communication from one or more radios (not shown) to one or more filter units 22 via one or more connections.

The AFU portion 14 includes one or more filter units 22 that are removably attached to the radio board 19. The filter unit 22 is configured to perform one or more filter functions as is known in the art such as filtering one or more radio signals to/from radios and to/from other portions of the AFU portion 14. The AFU portion 14 includes a liner 20 such as an electromagnetic compatibility (EMC) liner and one or more clamp elements 24 (collectively referred to as clamp element 24). The clamp element 24 is configured to at least, in part, provide for individual removal and replacement of a filter unit without negatively affecting the remaining filter units that may already be configured and/or calibrated, as described herein. The AFU portion 14 includes an antenna unit 26 that includes one or more antennas (not shown) and is configured to be removably attachable to one or more filter units 22. The AFU portion 14 further includes a radome 18 that encloses the antenna unit 26 in order to help shield the antenna unit 26 from the outside environment.

Figure 3:
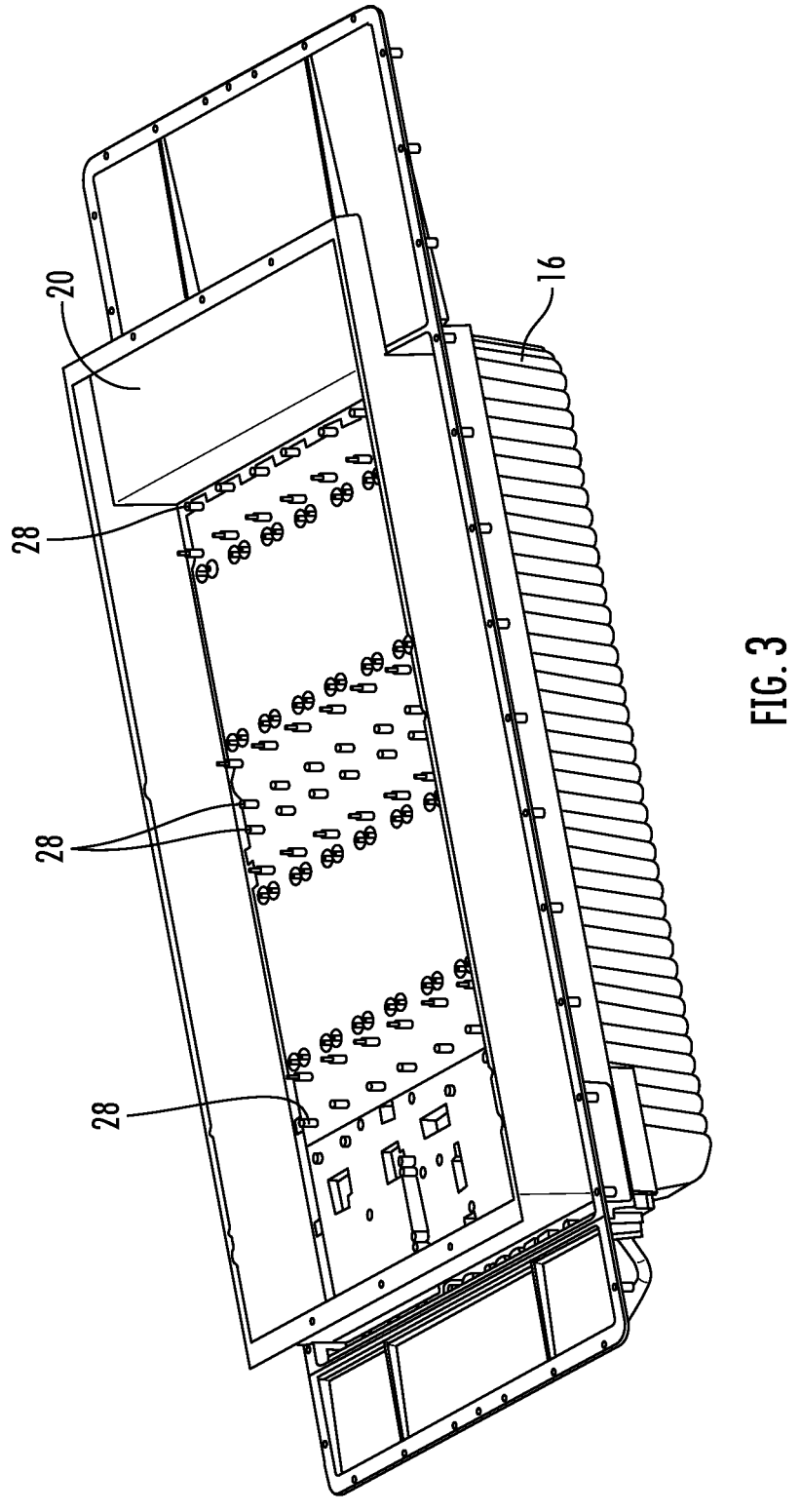
FIG. 3 is a diagram of a perspective view of a portion of the radio assembly during a step in the assembly process in accordance with some embodiments of the present disclosure.

FIG. 3 is a diagram of a perspective view of a portion of the radio assembly 10 during a step in the assembly process. In particular, the radio portion 12 is shown with the liner 20 removably attached to the radio portion 12 such as via one or more male fastening element (e.g., screws such as M4 screws). The radio board 19 includes one or more radio mating elements 28 (collectively referred to as radio mating element 28) extending from a first side of the radio board 19. For example, the radio mating element 28 may extend perpendicular to the first side. In one or more embodiments, the first side of the radio board 19 is opposite a second side of the radio board 19 that is adjacent to the heatsink 16. For example, in one or more embodiments, the radio mating elements 28 are female mating elements that define circular threads that are configured to accept male fastening element (e.g., threaded screws). In one or more embodiments, the radio mating elements 28 allow for one or more components (e.g., filter units 22) to be removably attached to the radio board 19.

In one or more embodiments. The assembly process may generally start with FIG. 3 and then proceed in the following order: FIG. 4, FIG. 5, FIG. 10, FIG. 11, FIG. 12 and FIG. 13.

Figure 4:
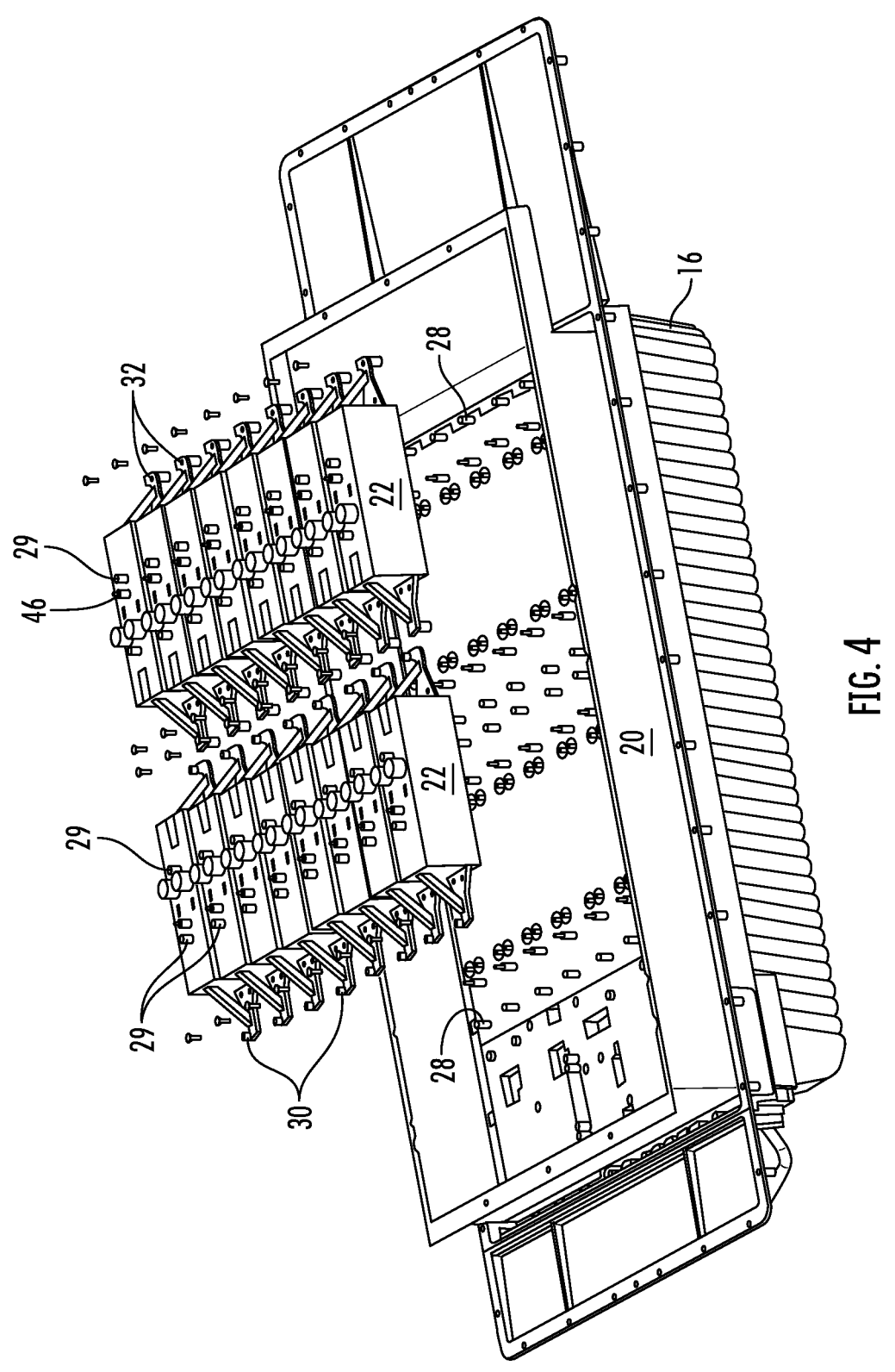
FIG. 4 is a diagram of a perspective view of a portion of the radio assembly during another step of the assembly process in accordance with some embodiments of the present disclosure.

FIG. 4 is a diagram of a perspective view of a portion of the radio assembly 10 during another step of the assembly process. The radio assembly 10 includes a plurality of filter units 22 that are removably attached to the radio board 19. Once removably attached, respective branches (e.g., respective radio and filter unit 22 in electrical communication with each other) may be calibrated per existing calibration methods. As used herein, a "branch" may refer to a receive or transmit path within a duplex filter unit 22 to antenna in the antenna unit 26 via a common antenna port.

The filter unit 22 includes a first filter mating element 29 and second filter mating element 30. In one or more embodiments, the first filter mating element 29 and second filter mating element 30 are female mating elements that define circular threads that are configured to accept male fastening element (e.g., threaded screws). In one or more embodiments, the first filter mating element 29 extend from or is located at a first side of the filter unit 22 and is configured to receive a male mating element for removably attaching the antenna unit 26 to one or more filter units 22. In one or more embodiments, a first end of second filter mating element 30 is configured to be in physical contact with the radio board 19 while a second end of the second filter mating element 30 is configured to accept a male mating element. The first end of second filter mating element 30 is opposite the second end of second filter mating element 30. In one or more embodiments, each second filter mating element 30 is a threaded blind hole. Further, the filter unit 22 includes an alignment shaft 46 described in detail below.

The filter unit 22 also includes a filter via 32 that is configured to allow access to male mating element removably attached to the radio mating element 28, as described herein. The filter via 32 may be defined by a portion of filter unit 22 that extends out from filter unit 22. In one or more embodiments, the filter via 32 has an axial direction that is parallel to the axial direction of radio mating element 28. Each filter via 32 extends in the same axial direction as of the axial direction of the filter mating element.

Figure 5:
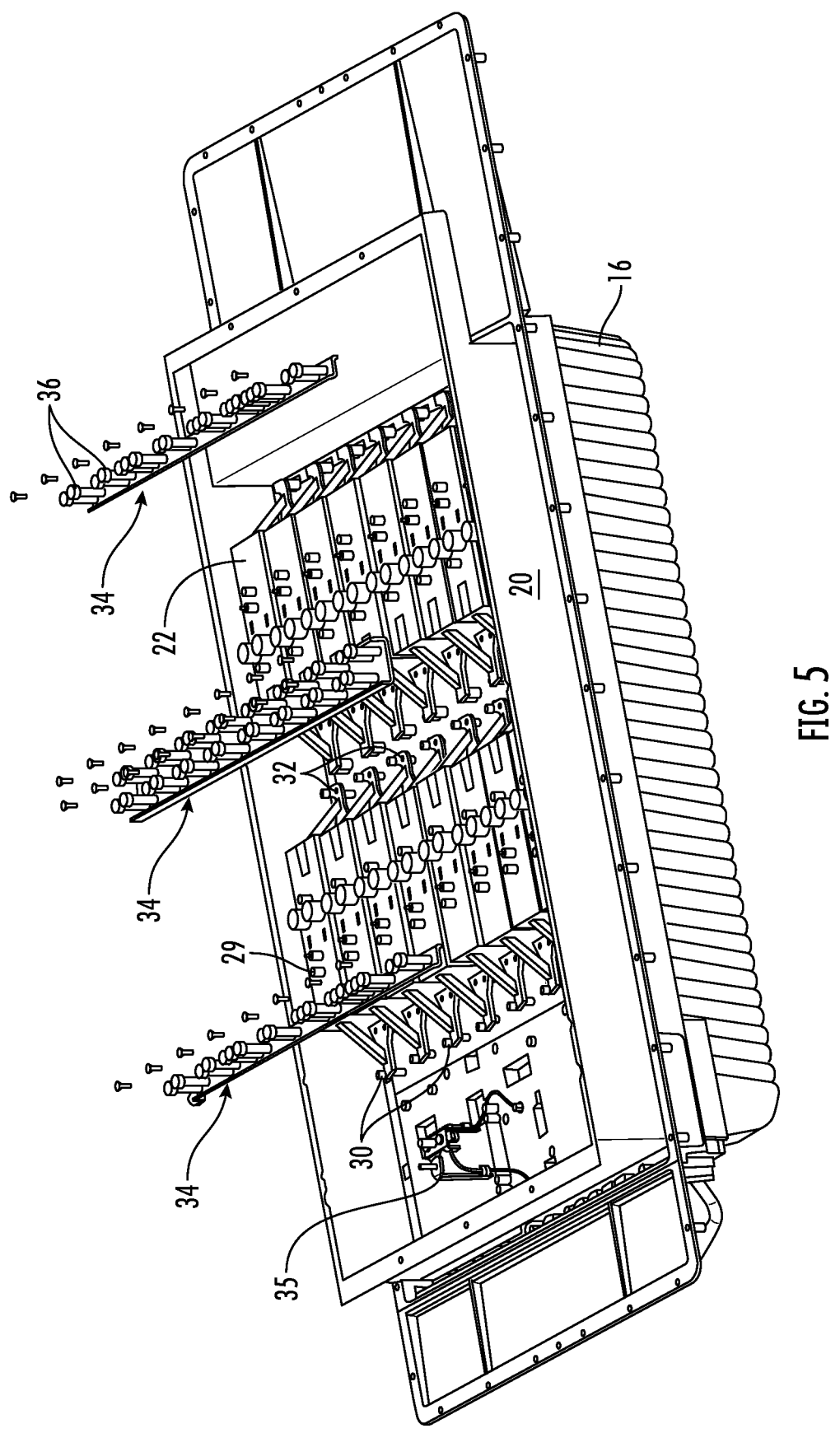
FIG. 5 is a diagram of a perspective view of a portion of the radio assembly during another step of the assembly process in accordance with some embodiments of the present disclosure.

FIG. 5 is a diagram of a perspective view of a portion of the radio assembly 10 during another step of the assembly process. Individual filter units 22 are aligned to the radio board 19 via an alignment pin (not shown). Once all the filter units 22 are aligned to the radio board 19, the clamp elements 34 tie all the filter units 22 together such that the filter units 22 will mate in the same position upon reassembly of the AFU portion 14 to the radio portion 12.

For example, the filter unit 22 is removably attached to the radio board 19 via male fastening element removably attached to the radio mating element 28 while the second filter mating element 30 is configured to receive a male fastening element via the clamp element 34 (e.g., clamp element 34a, 34b). Each second filter mating element 30 extends in an axial direction of one of the threaded blind hole and threaded through hole. The clamp element 34 defines clamp via (not shown) and the retaining elements 36. The clamp elements 34 are removably attached to the plurality of filter units 22 by mating a second plurality of fastening elements through the plurality of clamp vias and to the plurality of second filter mating elements 30.

The clamp elements 34a-34b are configured to join a plurality of filter units 22 together by resting on a plurality of second filter mating elements 30 and accepting a male fastening element via the retaining element 36 such as to removably attached the clamp element 34 to the filter units 22. The clamp element 34 may be a single or double-row clamp element 34. For example, the clamp element 34a is a double-row clamp while the clamp element 34b is a single-row clamp element 34. That is, each of a first subset of the plurality of clamp elements 34 define a first number clamp vias 50 and a first number of retaining elements 36 where each of a second subset of the plurality of clamp elements 34 define a second number clamp vias 50 and a second number of retaining elements 36 greater than the first number clamp vias 50 and the first number of retaining elements 36, and retain a greater number of filter units 22 than each of the first subset of the plurality of clamp elements 34 when the plurality of clamp elements 34 are removably attached to the filter units 22.

Also, during assembly, antenna CAL/remote electric tilt (AntCal/RET) bracket 35 is installed. ANT CAL is a function that allows a single transmit/receive branch to be calibrated using a signal that senses the antenna power level through the antenna CAL connector. The RET function controls the motor that controls down tilt of the antenna signal. Further, in one or more embodiments, the retaining element 36 is configured to retain male fastening element, as described herein. For example, each of the plurality of retaining elements 36 is configured to retain a respective one of the first plurality of fastening elements after the respective one of the first plurality of fastening elements is unfastened from the respective radio mating element 28.

Figure 6:
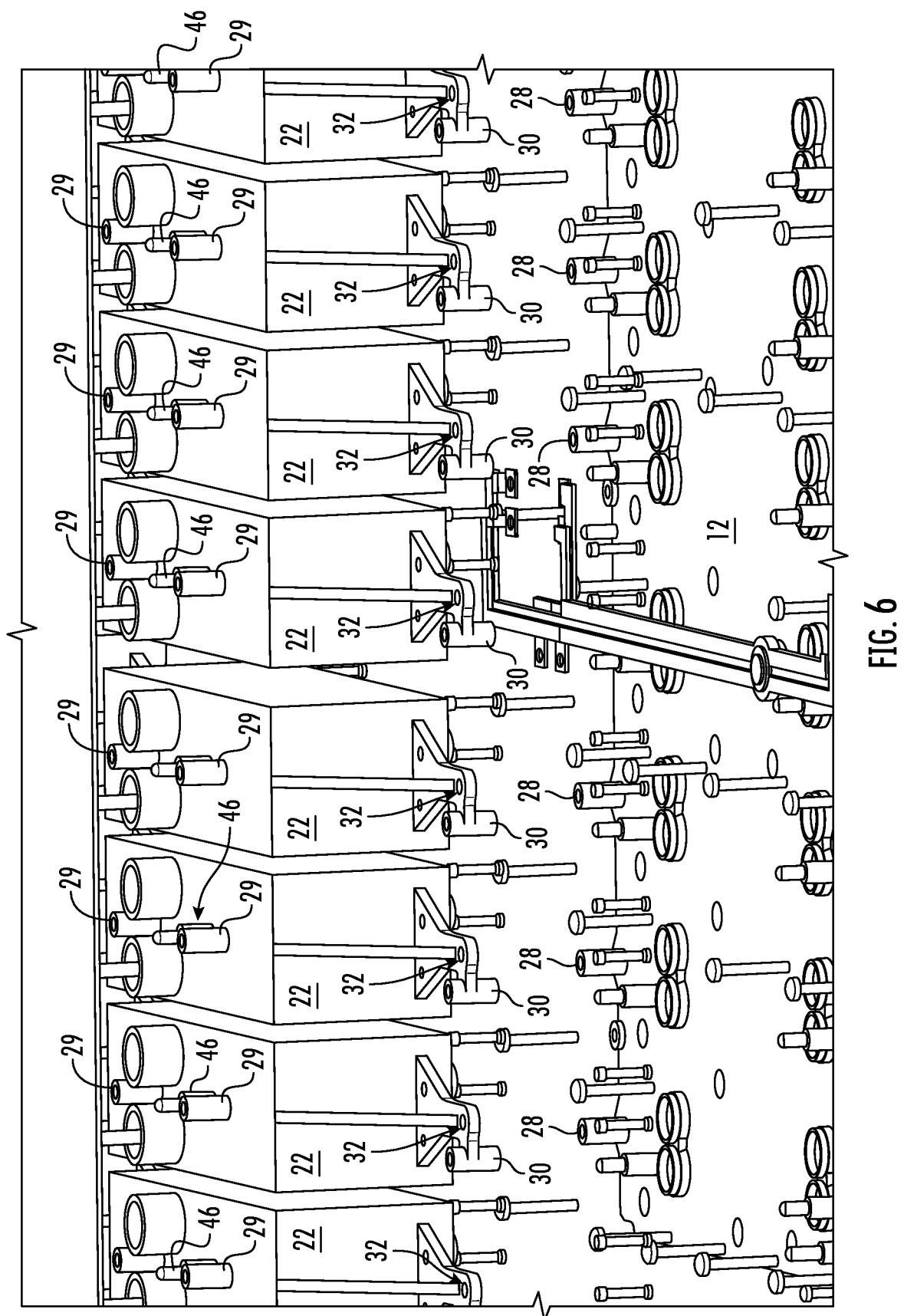
FIG. 6 is a diagram of a portion of the exploded view of the radio assembly in accordance with some embodiments of the present disclosure.

FIG. 6 is a diagram of a portion of the exploded view of the radio assembly 10. Specifically, in one or more embodiments, second filter mating element 30 of filter unit 22 is a cylinder shape that defines a void where the threads are position within the void. Further, second filter mating element 30 is positioned on a portion of filter unit 22 that extends from the filter unit 22 along with the filter via 32. For example, a portion of filter unit 22 that extends away or way from the filter unit 22 perpendicular to one side of the filter unit 22.

Figure 7:
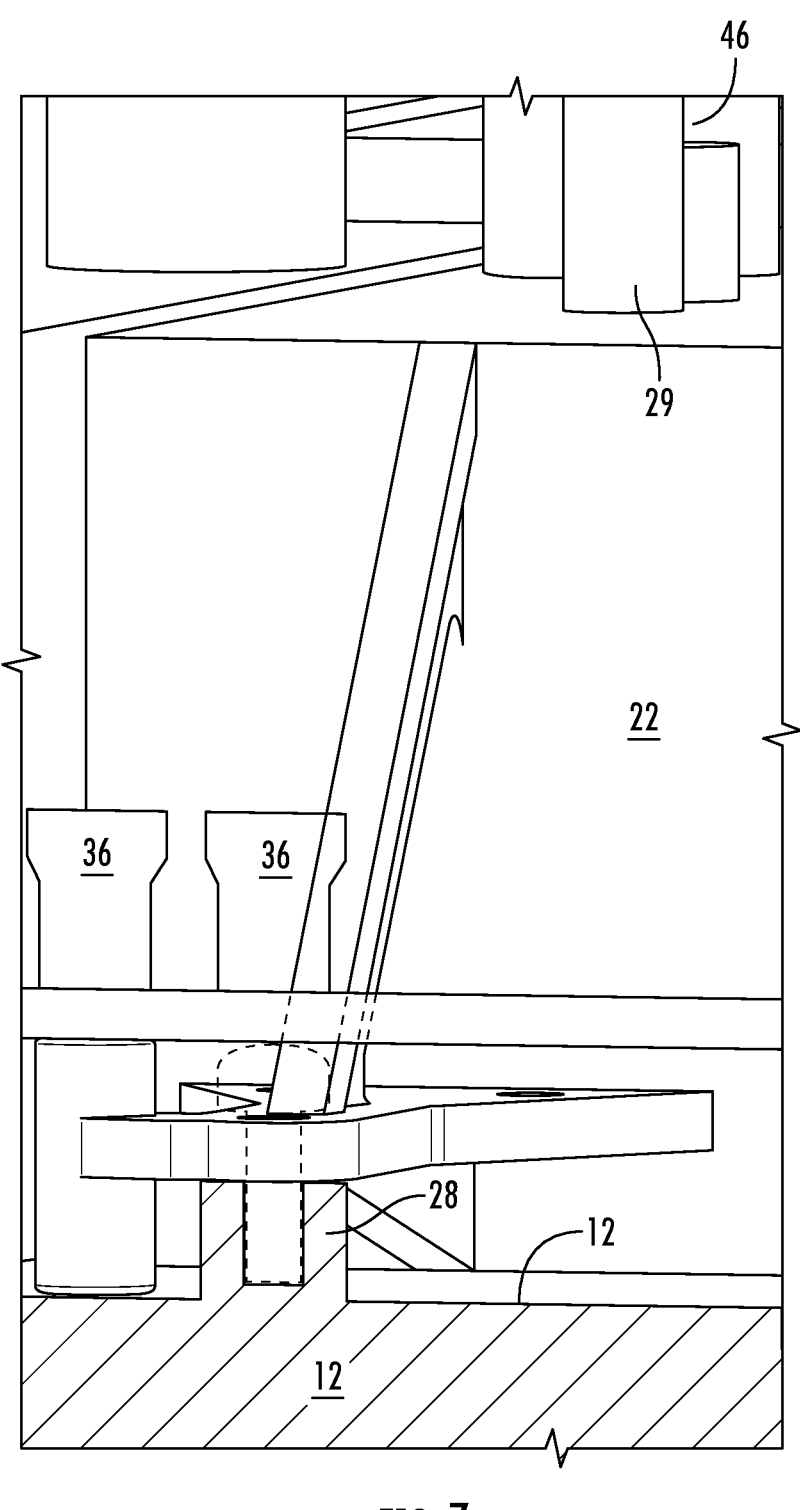
FIG. 7 is a diagram of a portion of the radio assembly where filter unit is removably attached to the radio portion via a male fastening element in accordance with some embodiments of the present disclosure.

FIG. 7 is a diagram of a portion of the radio assembly 10 where the filter unit 22 is removably attached to the radio portion 12 (i.e., radio board 19) via a male fastening element. Clamp element 34 is configured to make physical contact with the second filter mating element 30 where another male fastening element is configured to removably attach clamp element 34 to the filter unit 22 via the second filter mating element 30. In one or more embodiments, male fastening element that is removably attached (e.g., screwed into) to radio mating element is positioned on one side of the clamp element 34, but the male fastening element will go through the filter via 32 and to the retaining element 36 to be retained when the male fastening element is removed or unscrewed.

Figure 8:
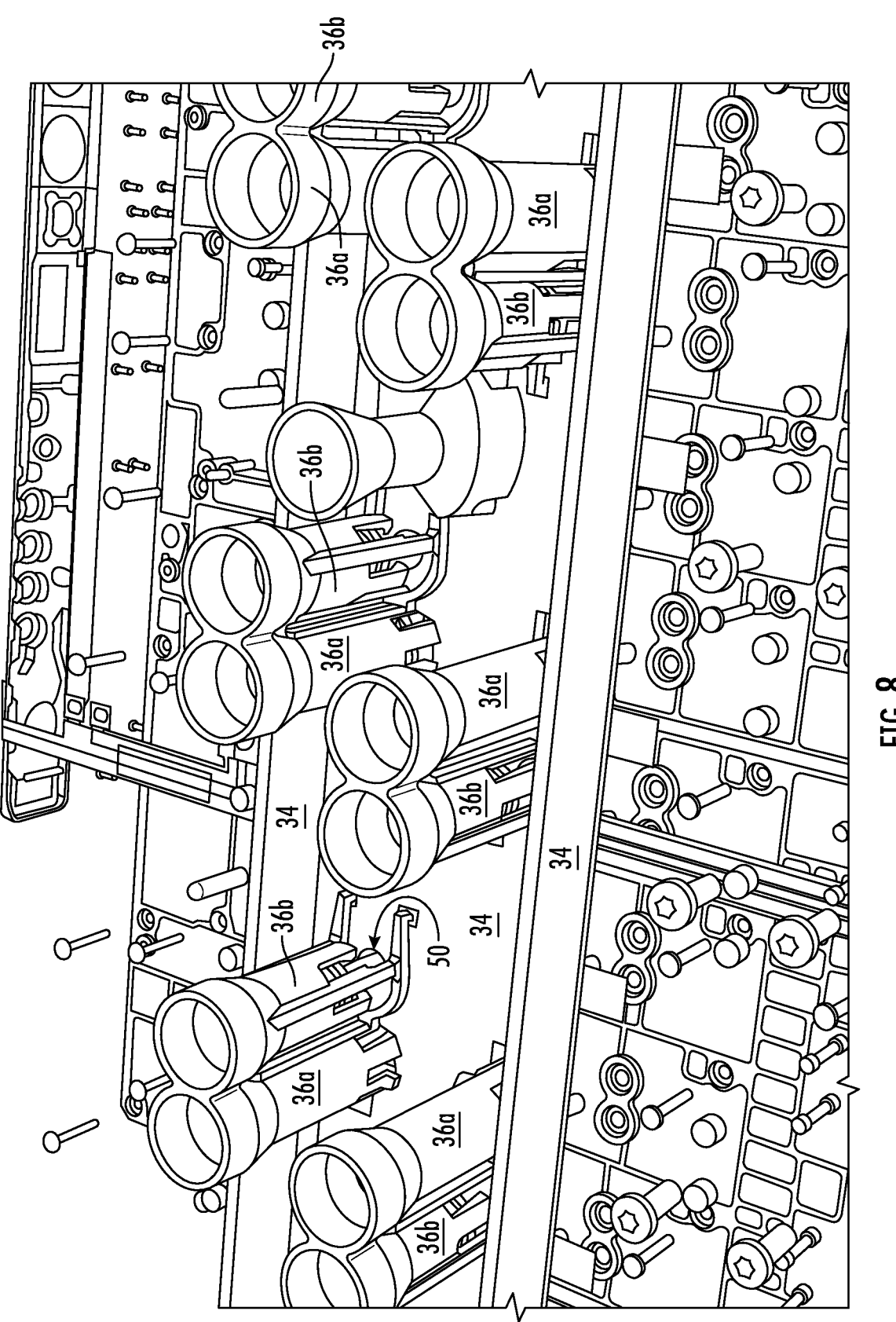
FIG. 8 is a diagram of a portion of the exploded view of the radio assembly that includes a perspective view of a clamp element in accordance with some embodiments of the present disclosure.

FIG. 8 is a diagram of a portion of the exploded view of the radio assembly 10 that includes a perspective view of a first side of the clamp element 34. The first side of the clamp element 34 includes a plurality of retaining elements 36a and 36b where the retaining element 36a is different from the retaining element 36b. In one or more embodiments, the retaining element 36b includes a retaining element mechanism or structure (described herein) for removably retaining a male fastening element. For example, the retaining element structure may be configured to snap fit to a head portion of a screw (e.g., male fastening element) such as when the screw is unfastened/unscrewed from a fastening element which causes the head of the screw to move into the retaining element structure. That is, the retaining element 36b defines a snap-fit element that is configured to snap-fit onto a portion of the respective one of the first plurality of fastening elements based on the respective one of the first plurality of fastening elements being unfastened from the respective radio mating element 28. In one or more embodiments, the snap-fit element extends through the clamp element 34. The screw may remain retained by the retaining element structure until the screw is re-fastened to the fastening element such as to cause the head of the screw to move out of the retaining element structure.

In one or more embodiments, the retaining elements 36a and 36b include the same retaining element structure (described herein) but the retaining element structures are positioned at different heights of the respective retaining element 36. For example, retaining element mechanism of the retaining element 36b may be offset more from the first side of the clamp element 34 than retaining element mechanism of retaining element 36a. In other words, the clamp element 34 includes a second plurality of retaining elements 36b where each of the second plurality of retaining elements 36b are positioned over a respective clamp via, and include a snap-fit portion positioned on one side of the clamp element 34.

Figure 9:
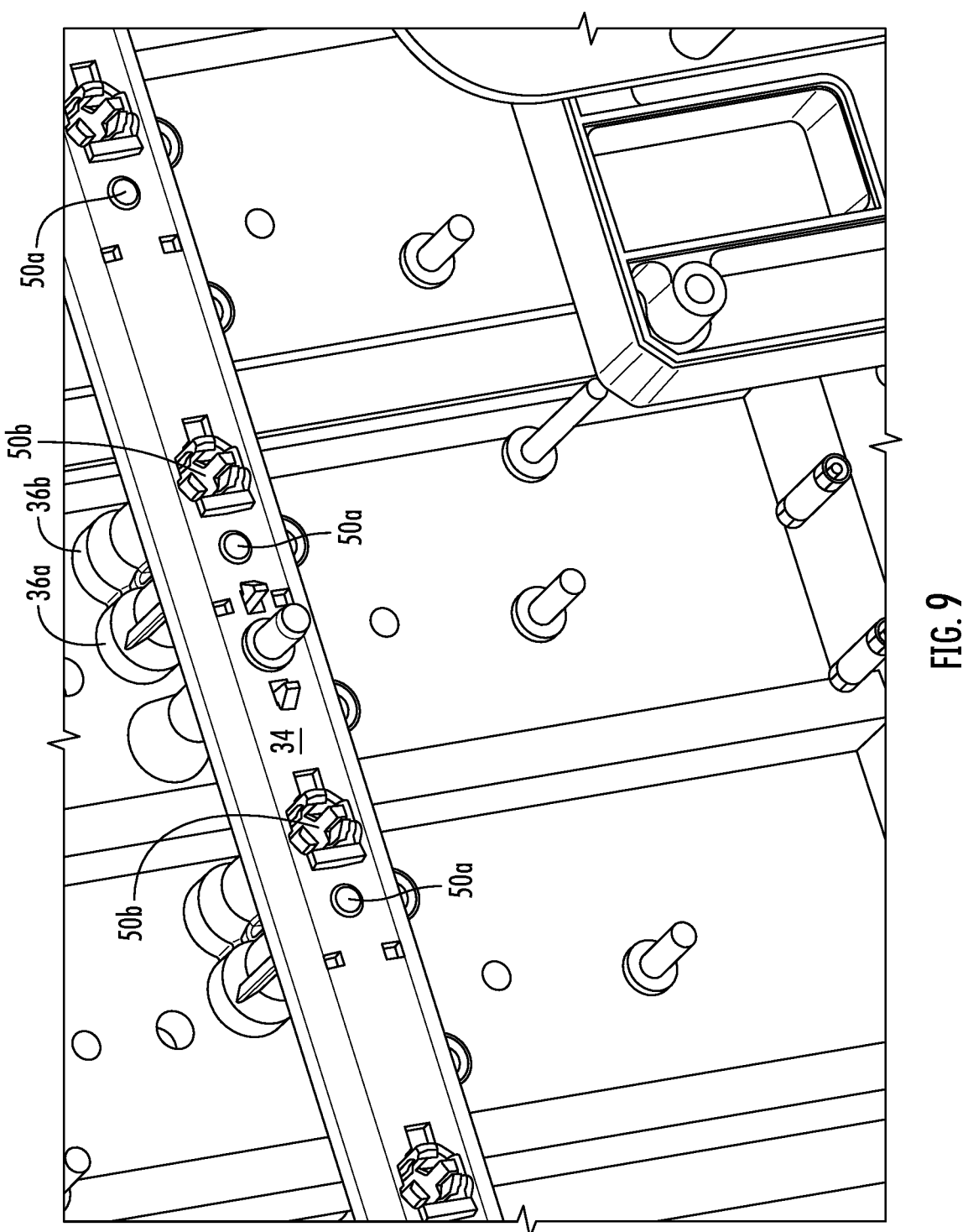
FIG. 9 is a diagram of a portion of the exploded view of the radio assembly that includes a perspective view of the clamp element in accordance with some embodiments of the present disclosure.

FIG. 9 is a diagram of a portion of the exploded view of the radio assembly 10 that includes a perspective view of a second side of the clamp element 34 that is opposite the first side of the clamp element 34. The second side may be referred to as the underside of the clamp element 34. In particular, the clamp via 50 may have two different size vias, 50a and 50b. The clamp via 50a may be sized to receive a mating portion of a male fastening element such as a threaded portion of a screw while being sized smaller than the head of the screw, thereby allowing the screw to hold the clamp element 34 in position relative to the filter unit 22 when mated with the second filter mating element 30. In one or more embodiments, the clamp via 50b has a greater diameter than the clamp via 50a since the clamp via 50b is sized to allow the screw to be removably fastened to the radio mating element 28. That is, a screw (e.g., male fastening element) is fastened through the retaining element 36b and the clamp via 50b to the radio mating element 28 where the head of the screw moves out of the retaining element 36b as the screw is being fastened. After being removably fastened, the screw may rest adjacent to the second side of the clamp element 34 as shown in FIG. 7.

Figure 10:
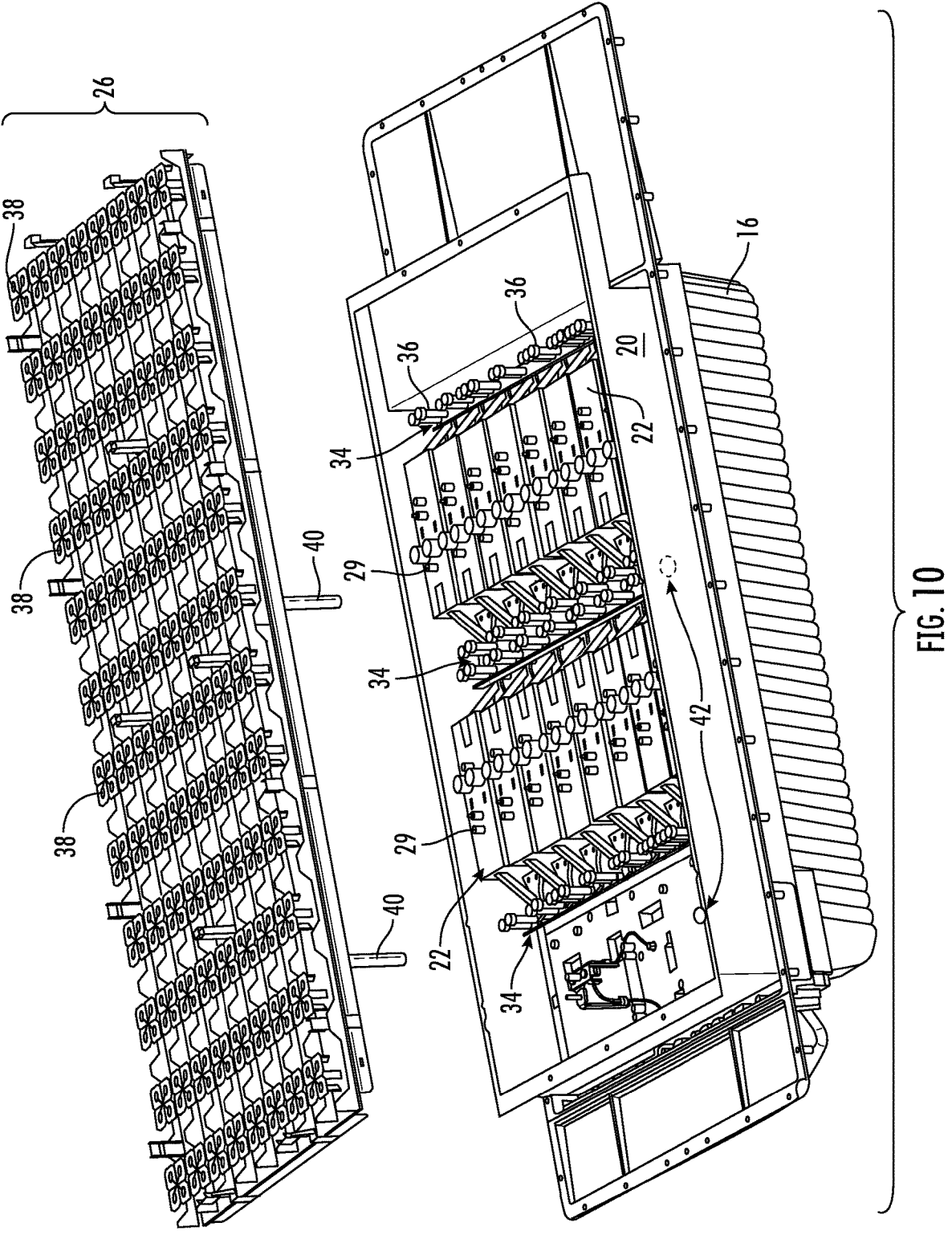
FIG. 10 is a diagram of a perspective view of a portion of the radio assembly during another step of the assembly process in accordance with some embodiments of the present disclosure.

FIG. 10 is a diagram of a perspective view of a portion of the radio assembly 10 during another step of the assembly process. The antenna unit 26 is assembled to the radio portion 12 (see FIG. 2) and screwed to the filter units 22 and AntCal/RET bracket 35. In particular, the filter units 22 were removably attached to the radio board 19 and clamp element 34 is removably attached to the filter units 22 as described with respect to FIG. 5. The antenna unit 26 includes one or more antennas 38 (collectively referred to as antenna 38) where the antenna unit 26 is mounted to filter units 22. In order to help align the antenna unit 26 with the filter units 22, the antenna unit 26 includes the first alignment protrusions 40 that are configured to removably mate with the coarse alignment vias 42. The predefined position of the coarse alignment vias 42 helps ensure that the antenna unit 26 will be in electrical connection with the filter unit 22 once mounting is complete. While two first alignment protrusions 40 are shown, the antenna unit 26 may include other number of first alignment protrusions 40 in accordance with the teachings of the present disclosure. After assembly of the antenna unit 26 to the radio portion 12, the assembly is KRD ready for production testing including PIM testing that can be performed for the various branches. KRD is the complete top-level assembly product number consisting of a radio and antenna.

Figure 11:
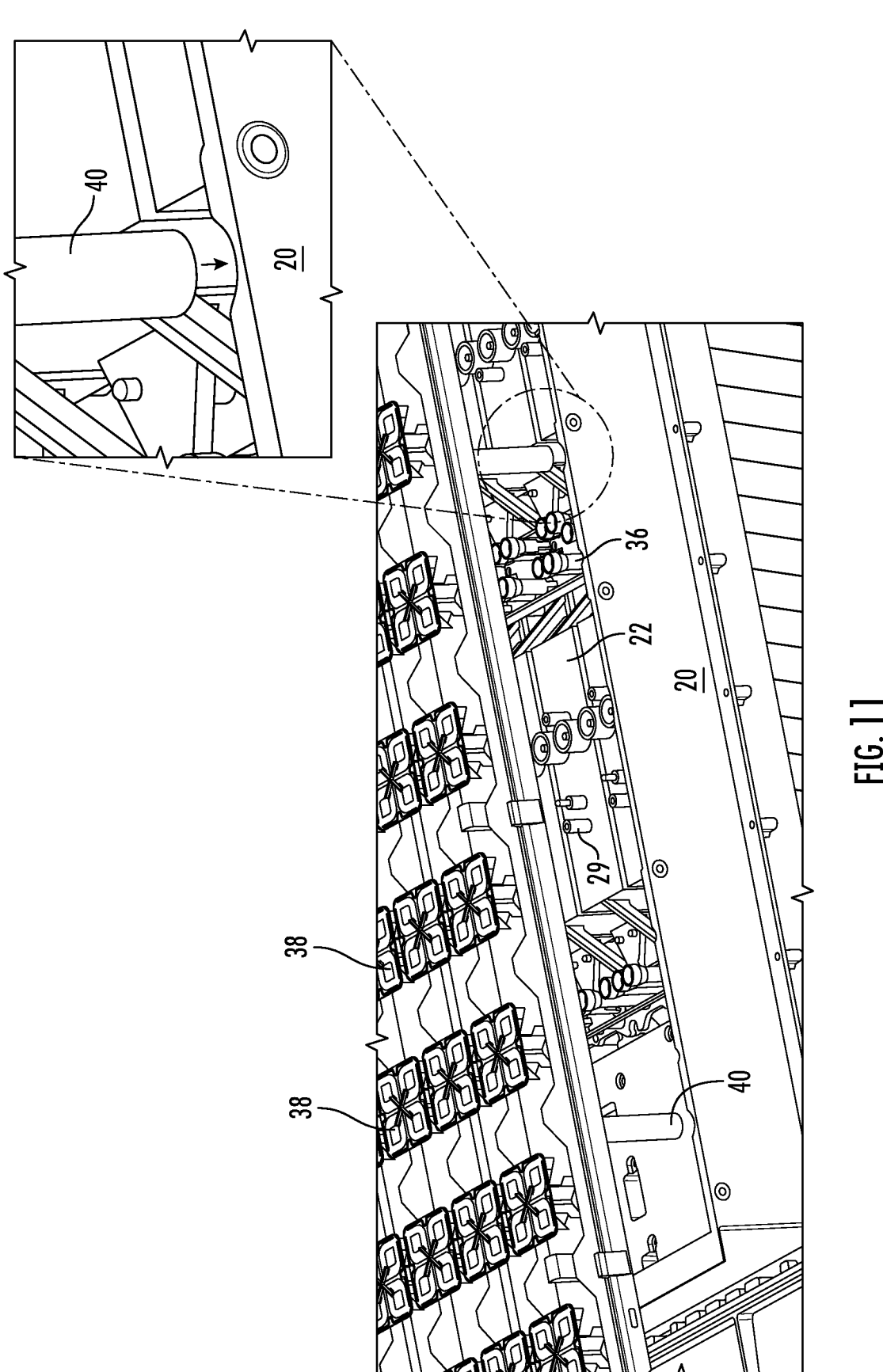
FIG. 11 is a diagram of a perspective view of a portion of the radio assembly during the mounting step described in FIG. 10 in accordance with some embodiments of the present disclosure.

FIG. 11 is a diagram of a perspective view of a portion of the radio assembly during the mounting step described in FIG. 10. For example, the first alignment protrusions 40 are guided into the coarse alignment vias 42 for coarse alignment of the antenna unit 26 with the filter units 22. In other words, the antenna unit 26 includes a plurality of the first alignment protrusions 40 extending from a first side of the antenna unit 26 where the radio board 19 defines a plurality of coarse alignment 10 vias 42 configured to receive the plurality of first alignment protrusions 40 of the antenna unit 26. In one or more embodiments, the first alignment protrusions 40 are pre-aligned with the liner 20.

Figure 12:
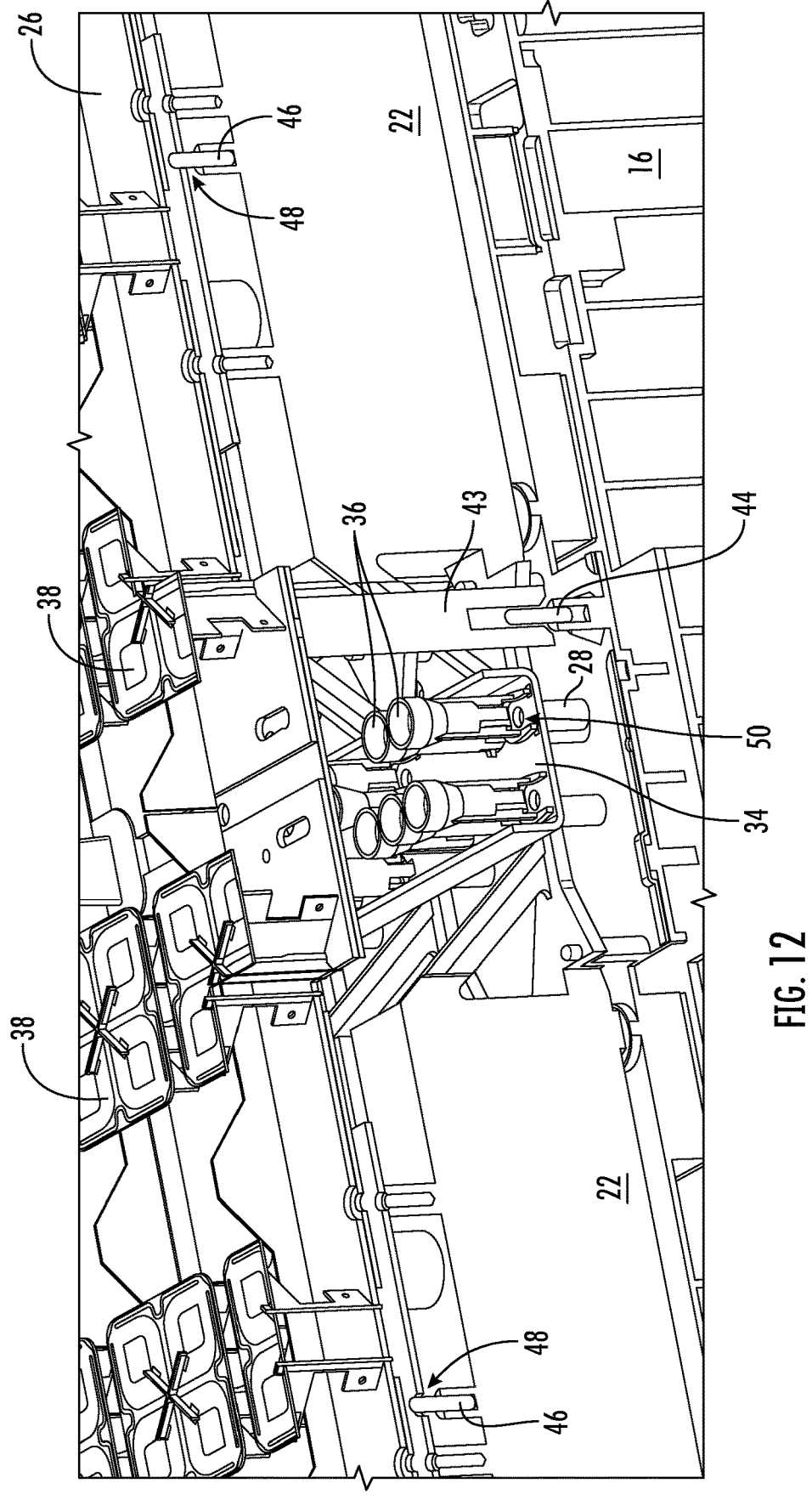
FIG. 12 is a diagram of another perspective view of a portion of the radio assembly 10 during the mounting step described in FIG. 10 in accordance with some embodiments of the present disclosure.

FIG. 12 is a diagram of another perspective view of a portion of radio assembly 10 during the mounting step described in FIG. 10. In particular, the antenna unit 26 includes the second alignment protrusions 43 configured to accept an alignment pin from the radio portion 12 and/or radio board 19 to allow for medium/medium level alignment. For example, the antenna unit 26 includes a plurality of second alignment protrusions 43 extending from the first side of the antenna unit 26 where each of the second alignment protrusions 43 defines a blind hole, and the radio board 19 including a plurality of alignment pins 44. Each of the plurality of alignment pins 44 configured to mate with a respective blind hole of the plurality of second alignment protrusions 43.

The antenna unit 26 further includes the slot 48 (e.g., PCB slot/via) that is matable with the alignment shaft 46 of filter unit 22 to provide a fine level of alignment (i.e., more accurate alignment than medium and coarse alignment. For example, each of the plurality of filter units 22 includes an alignment shaft 46 extending from the first side of the filter unit 22 where the antenna unit 26 defines a plurality of slots 48, each of the plurality of slots 48 configured to receive a respective alignment shaft 46 of a filter unit 22.

That is, one or more embodiments provide 3 levels of alignment via 3 alignment guiding systems/structures where each level provides a different level of alignment accuracy, e.g., coarse alignment, medium level alignment and fine alignment.

Figure 13:
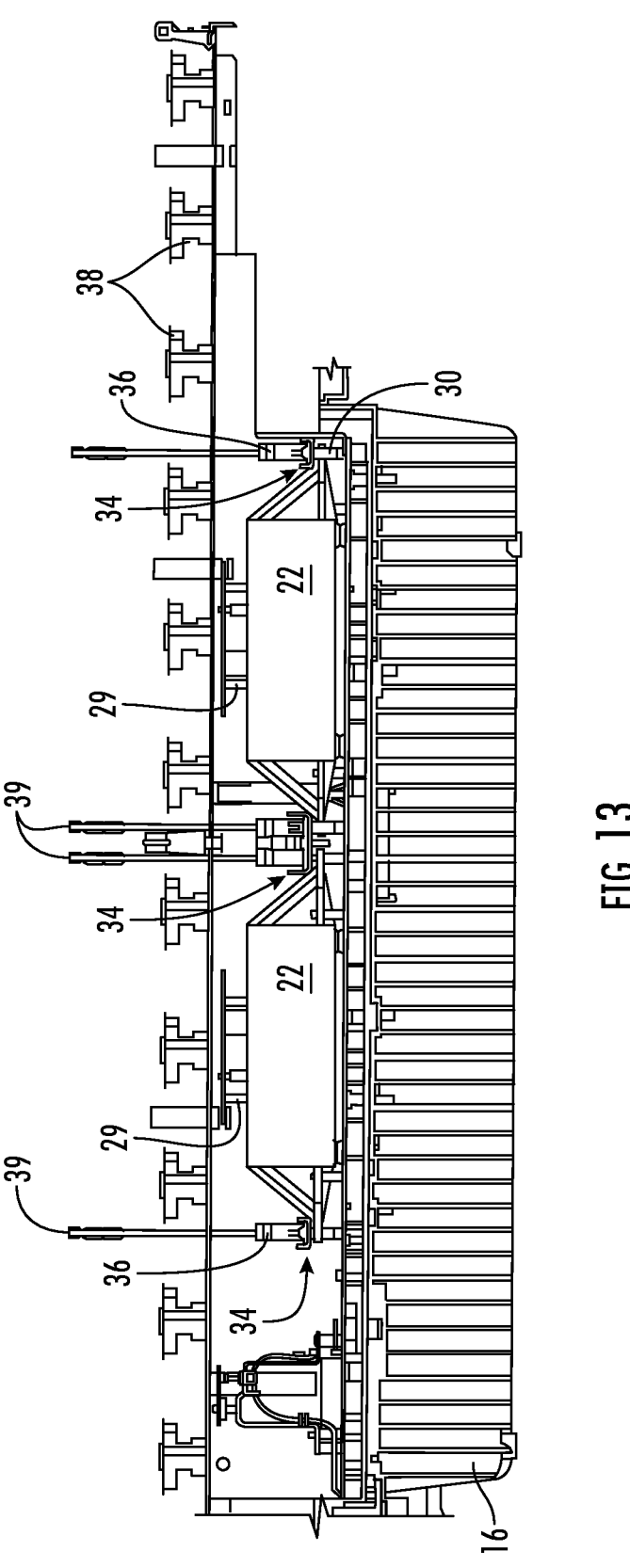
FIG. 13 is a diagram of a side view of a portion of the radio assembly after the antenna unit is mounted to filter units in accordance with some embodiments of the present disclosure.

FIG. 13 is a diagram of a side view of a portion of the radio assembly 10 after the antenna unit 26 is mounted to the filter units 22. In one or more embodiments, mating tool 39 is used to removably fasten the male fastening element (e.g., screws) used to removably fasten filter units 22 to the radio board 19 and to removably fasten clamp element 34 to the filter unit 22. For example, the antenna unit 26 may have access vias (described with respect to FIG. 15) that provide the mating tool 39 access to the radio portion 12, radio board 19, filter unit 22, retaining elements 36, etc., which in turn provides access to male fastening element (e.g., screws) for fastening and unfastening one or more male fastening element.

Figure 14:
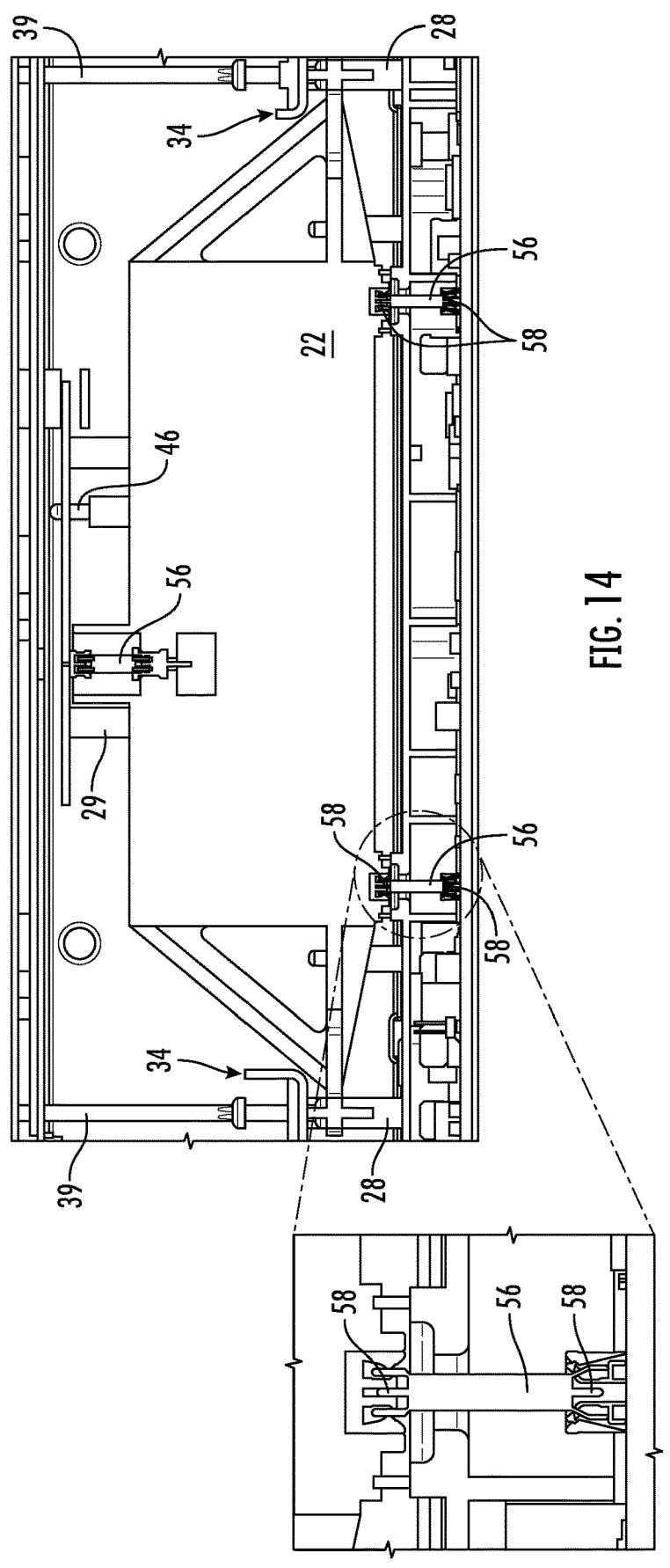
FIG. 14 is a diagram of a side view of a portion of the radio assembly 10 of FIG. 13 in accordance with some embodiments of the present disclosure.

FIG. 14 is a diagram of a side view of a portion of the radio assembly 10 of FIG. 13. In particular, the radio cover guide pins 57 provide alignment for each filter unit 22. Further, one or more gaskets 56 may be removably attached to one or more gasket mating elements 58 where the gaskets provide cushion during assembly to protect connectors and bullets (described below). Contacts may be made by torquing male fastening element (e.g., screws/mounting screws).

Figure 15:
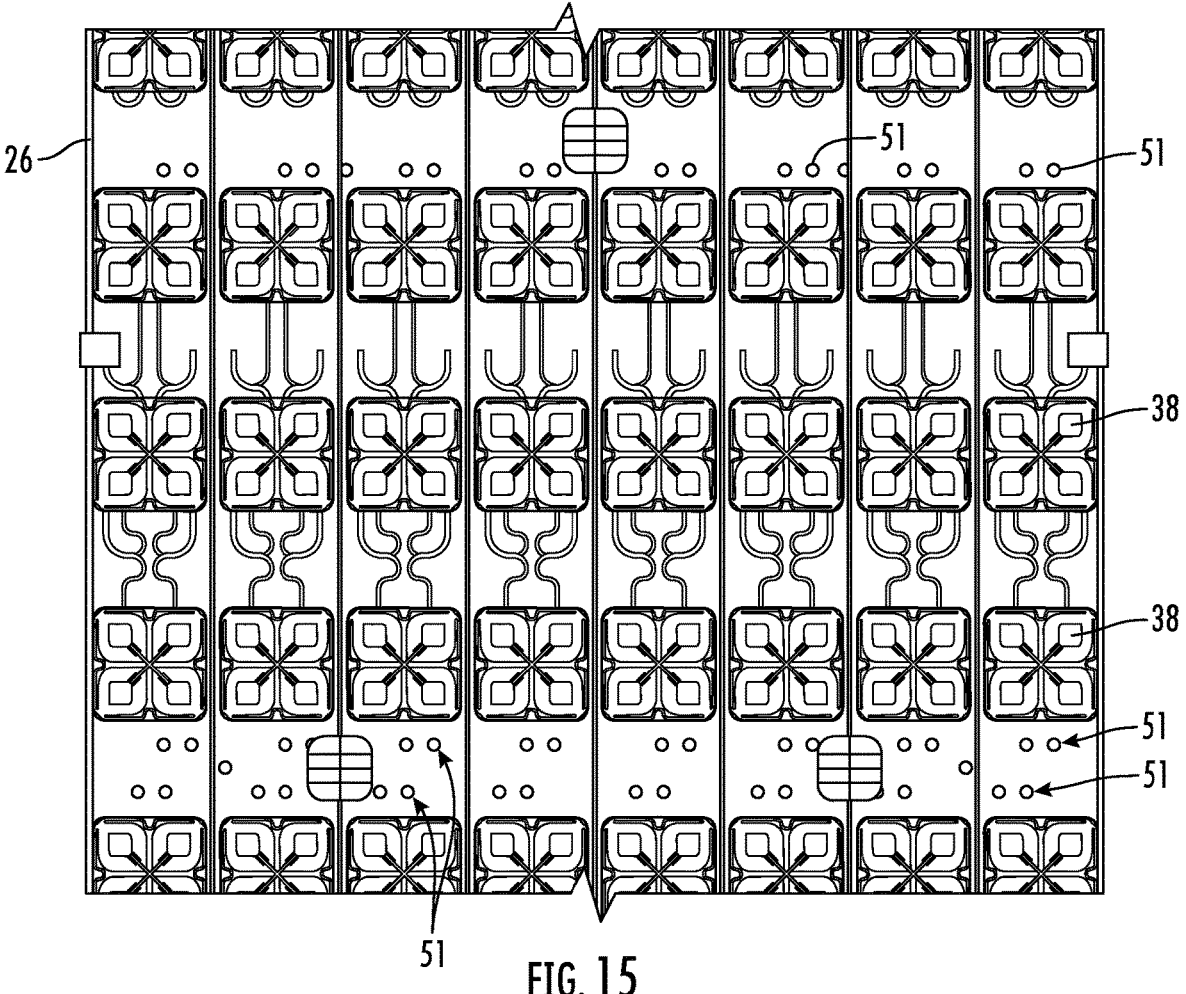
FIG. 15 is a diagram of a top view of the antenna unit in accordance with some embodiments of the present disclosure.

FIG. 15 is a diagram of a top view of the antenna unit 26 according to some embodiments of the present disclosure. The antenna unit 26 defines a plurality of access vias 51, described above with respect to FIG. 13. For example, an antenna unit 26 defines a plurality of access vias 51 where the antenna unit 26 is removably attached to the plurality of filter units 22 by mating a third plurality of fastening elements through the plurality of access vias 51 and to the first filter mating elements 29. For example, the antenna unit 26 defines a plurality of access vias 51 that provide access to the first plurality of fasteners, the second plurality of fasteners and third plurality of fasteners through the antenna unit 26. While access vias 51 and other vias described herein are shown as being defined by a circular shape, other shapes are equally applicable.

Referring back to FIG. 13, once the radio assembly 10 has been put together with the various male fastening element removably fastened throughout and with radios, the filter units 22 and antenna unit 26 in electrical communication with each other (including calibration), the radio assembly 10 may undergo one or more PIM test. For example, each branch (e.g., the respective combination of radio, the filter unit 22 and antenna 38 in electrical communication with each other) is tested for PIM. If all branches pass the PIM test(s), then radio assembly 10 may be ready for use.

However, as often occurs, at least one branch fails at least one PIM test. In this case, the filter unit 22 of the failing branch is unfastened from the clamp element 34, but remains fastened to the radio board 19. For example, one or more screws associated with the failing filter unit 22 that are positioned/located in respective retaining elements 36a (as illustrated in FIG. 8) are unfastened and retained by respective retaining element 36a such as to unfasten the failing filter unit 22 from the clamp element 34. However, the one or more screws associated with the failing filter unit 22 that are positioned below respective retaining elements 36b (or on the other side of clamp element 34) (as illustrated in FIG. 8) are such that the failing filter unit 22 remains fastened to the radio board 19. Further, one or more screws associated with the failing filter unit 22 are unfastened from respective first filter mating elements 29 such as to unfasten the failing filter unit 22 from the antenna unit 26. Hence, the failing filter unit 22 is unfastened from the clamp element 34 and antenna unit 26 but remains fastened (or removably attached) to the radio board 19.

Figure 16:
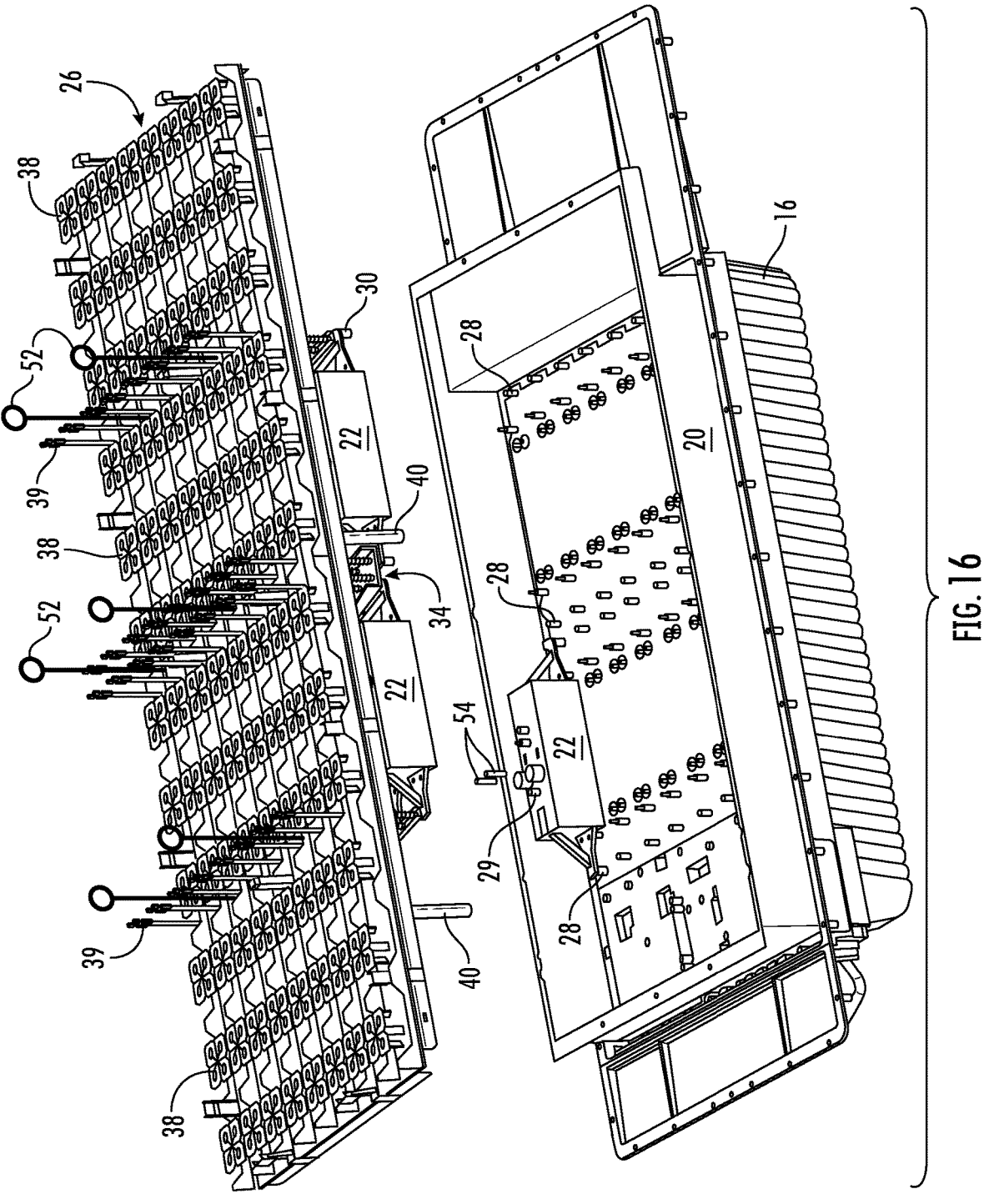
FIG. 16 is a diagram of a perspective view of the removable antenna unit detached from the radio portion in accordance with some embodiments of the present disclosure.

As shown in FIG. 16, the failing filter unit 22 remains removably attached to the radio board 19 while the filter unit(s) 22 that passed the PIM test(s) remain removably attached to the antenna unit 26 when the antenna unit 26 is removed/separated from the radio portion 12. For example, a subset of the plurality of filter units 22 remaining removably attached to the radio board 19 while the remaining plurality of filter units 22 remain removably attached to the antenna unit 26 and plurality of clamp elements 34 based on whether: the second plurality of fastening elements are unfastened from a subset of the plurality of second filter mating elements 30 associated with the subset of the plurality of filter units 22, the third plurality of fastening elements associated with the subset of the plurality of filter units 22 are unfastened from respective first filter mating elements 29, and the first plurality of fastening elements associated with the remaining plurality of filter units 22 are unfastened from respective radio mating elements 28.

In particular, the AFU tool 52 is removably mated with the clamp element 34 via one or more clamp vias 50 such that the force used for lifting or separating the antenna unit 26 from the radio portion 12 are transferred to the clamp element 34 instead of the AFU portion 14. For example, the plurality of clamp elements 34 defines a plurality of tool mating elements that are configured to mate with a plurality of lifting tools (i.e., AFU tool 52) for lifting the antenna unit 26 and the remaining plurality of filter units 22 while the subset of the plurality of filter units 22 remains removably attached to the radio board 19. The plurality of access vias 51 are configured to provide access to the plurality of tool mating elements.

Further, in one example, the total weight of the AFU portion 14 may be approximately 15.7 kg (34.6 lbs) where the force used to lift this weight is transferred to the clamp element 34 instead of one or more sensitive portions of antenna unit 26. Hence, access is provided to the failing filter unit 22 for replacement without affecting or substantially affecting the previous calibrations performed on the filter unit(s) 22 that remain removably attached to antenna unit 26.

The failing filter unit 22 can be corrected by, for example, replacing the failing filter unit 22 with another (and fastening the new filter unit 22 to antenna unit 26) or replacing connector bullets 54 for that failing filter unit 22. Each filter unit 22 may have one or more bullets for electrically connecting the respective filter unit 22 to a respective antenna 38. After correction of the failing filter unit 22, the antenna unit 26 is lowered onto the radio portion 12 (i.e., placed back in contact with the radio portion 12) and the various fastening element to fasten the new filter unit 22 to clamp and the antenna unit 26 are re-fastened. After the radio assembly 10 has been put back together with the new filter unit 22, connectivity and/or calibration are verified and the radio assembly 10 undergoes the one or more PIM test(s) again.

In other words, in some embodiments, the following steps may be performed to repair/replace one or more failing filter units 22 in a failing branch.

the filter unit 22 of a failing branch is unfastened from the clamp element 34 using the access vias 51 from one side of antenna unit 26.

other filter units 22 with good branches (i.e., branches that meet a PIM criterion and/or pass a PIM test) are unfastened from the radio board 19 using the access vias 51 the clamp elements 34 are unfastened from the failing filter unit 22 using the access vias 51.

the AFU portion 14 is removed leaving the failing filter unit 22 on the radio board 19 but the remaining good filter units 22 remain removably attached to the AFU portion 14.

the failing filter unit 22 is corrected either by replacing the filter unit 22 or replacing or cleaning the bullet 54.

the repaired branch with repaired/replaced filter unit 22 is calibrated.

the AFU portion 14 is lowered or placed back into contact with the radio portion 12 with the clamp element 34 and branch filter units 22 screwed to clamp element 34.

KRD is verified for connectivity and calibration.

PIM test(s) are repeated.

Figure 17:
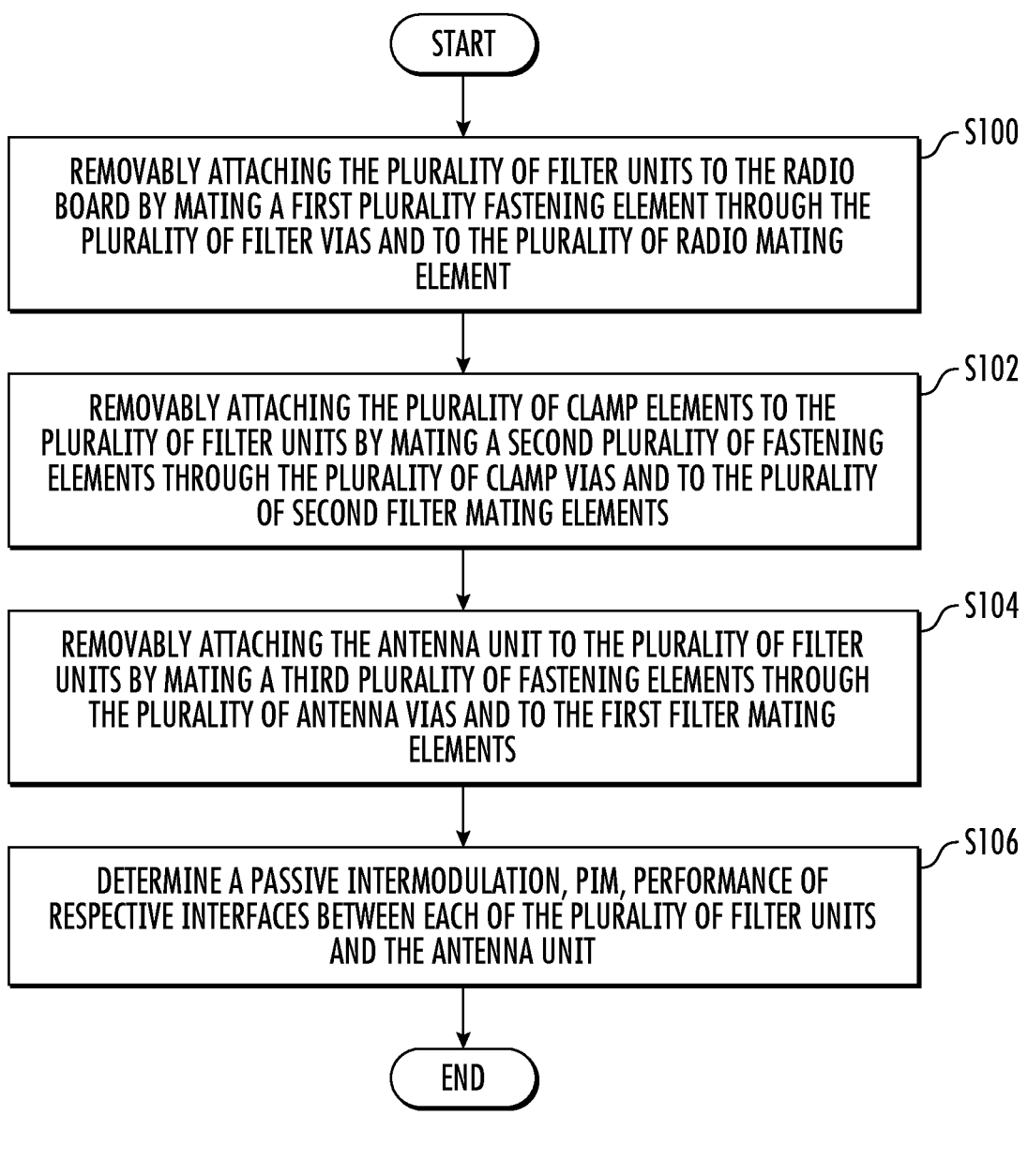
FIG. 17 is a flow diagram of a method for configuring the radio assembly in accordance with some embodiments of the present disclosure.

FIG. 17 is a flow diagram of a method for configuring a radio assembly 10 according to some embodiments of the present disclosure. The radio assembly 10 includes at least one radio, a plurality of filter units 22, a plurality of clamp elements 34 and an antenna unit 26 where the radio includes a radio board 19 including a plurality of radio mating elements 28 extending from a first side of the radio board 19. Each filter unit 22 includes a first filter mating element 29 at a first side of the filter unit and at least one extended portion extending from a second side of the filter unit 22, each extended portion defining a filter via 32 and a second filter mating element 30, a plurality of clamp elements 24, each of the plurality of clamp elements 34 define a plurality of clamp vias 50 and a plurality of retaining elements 36, an antenna unit 26 defines a plurality of access vias 51. The method includes removably attaching (Block S100) the plurality of filter units 22 to the radio board 19 by mating a first plurality fastening elements through the plurality of filter vias 32 and to the plurality of radio mating elements 28. The method includes removably attaching (Block S102) the plurality of clamp elements 34 to the plurality of filter units 22 by mating a second plurality of fastening elements through the plurality of clamp vias 50 and to the plurality of second filter mating elements 30. The method includes removably attaching (Block S104) the antenna unit 26 to the plurality of filter units 22 by mating a third plurality of fastening elements through the plurality of access vias 51 and to the first filter mating elements 29. The method includes determining (Block S106) a passive intermodulation, PIM, performance of respective interfaces between each of the plurality of filter units 22 and the antenna unit 26.

In one or more embodiments, the method further includes determining a subset of the plurality of filter units 22 fail to meet a PIM criterion. The method includes detaching the subset of the plurality of filter units 22 from the antenna unit 26 and the plurality of clamp elements 34 by: unfastening the second plurality of fastening elements from a subset of the plurality of second filter mating elements 30 associated with the subset of the plurality of filter units 22; and unfastening the third plurality of fastening elements associated with the subset of the plurality of filter units 22 from respective first filter mating elements 29, detaching the remaining of the plurality of filter units 22 from the radio board 19 by unfastening the first plurality of fastening elements associated with the remining plurality of filter units 22 from respective radio mating elements 28, removing the antenna unit 26 from the radio assembly 10 where the remaining plurality of filter units 22 remain removably attached to the antenna unit 26 and the plurality of clamp elements 34 while the subset of filter units 22 remain removably attached to the radio board 19, and replace the subset of filter units 22 with other filter units 22 while maintaining the PIM performance of respective interfaces between each of the remaining plurality of filter units 22 and the antenna unit 26.

Some Examples

Examples 1: Joining bars (e.g., clamp element 34) tying all filter units together into one antenna filter assembly (AFU portion 14) that allows for selectively removing the AFU portion 14 while leaving the faulty branch filter unit 22 behind thus enabling the ability to troubleshoot and repair select branches for PIM fault. This method allows pre-alignment and calibration of all branches such that the antenna and good filter unit assembly (AFU portion 14) (e.g., filter units 22 that pass PIM test(s)) can be removed and then replaced without needing individual filter unit 22 to radio alignment thus preserving the calibration between filter unit 22 and radio/antenna 38.

Example 2: Accessibility access ports (e.g., access via 51) from the front of the antenna unit 26 to selectively disconnect the filter units 22 from the joining bars allowing the faulty filter units 22 to be left behind (e.g., removably attached to radio board 19) when the AFU portion 14 is lifted off or removed from the assembly/radio portion 12.

Examples 3: Plastic guides (e.g., retaining elements 36) allowing blind access through the front of the antenna unit 26 to inner parts of the radio assembly 10 to enable removal of the faulty filter unit 22 from the joining bar/clamp element 34.

Example 4: Plastic guides allow the screws to be captured within the plastic part (e.g., retaining element mechanism) during the AFU portion 14 disassembly. This method holds the screws such that the screws will not come out nor fall into the radio cavities of radio assembly 10 and keep them captive in disassembled position and aligned when the AFU portion 14 is assembled back.

Example 5: Accessibility access and a lifting point via the AFU tool 52 to repair the radio and disassemble the AFU portion 14 which was created during the assembly. This allows the forces to be transferred to the joining bars instead of the antenna.

Therefore, one or more embodiments described herein provides an assembly that allows individual removal and replacement of a faulty branch connector without disassembly of the other connectors, thereby allowing, for example, antenna branches that meet a PIM criterion to remain assembled. Another benefit of one or more embodiments is that filters are also replaceable in a single antenna branch without affecting other good antenna branches. Filter replacement may be important because it may be the reason for poor inline PIM performance.

Hence, one or more embodiments provide one or more advantages as described herein such as providing a radio assembly that allows individual removal and replacement of a faulty branch connector without disassembly of the other connectors. Another advantage is that filter unit(s) 22 are also replaceable in a single branch without affecting other good branches (i.e., other branches that passed PIM test(s)). Filter unit 22 replacement may be important because in a small percentage of cases, the filter unit 22 itself it is the reason for poor inline PIM performance.

As will be appreciated by one of skill in the art, the concepts described herein may be embodied as a method, data processing system, computer program product and/or computer storage media storing an executable computer program. Accordingly, the concepts described herein may take the form of an entirely hardware embodiment, an entirely software embodiment or an embodiment combining software and hardware aspects all generally referred to herein as a "circuit" or "module." Any process, step, action and/or functionality described herein may be performed by, and/or associated to, a corresponding module, which may be implemented in software and/or firmware and/or hardware. Furthermore, the disclosure may take the form of a computer program product on a tangible computer usable storage medium having computer program code embodied in the medium that can be executed by a computer. Any suitable tangible computer readable medium may be utilized including hard disks, CD-ROMs, electronic storage devices, optical storage devices, or magnetic storage devices.

Some embodiments are described herein with reference to flowchart illustrations and/or block diagrams of methods, systems and computer program products. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer (to thereby create a special purpose computer), special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable memory or storage medium that can direct a computer or other programmable data processing apparatus to function in a particular manner, such that the instructions stored in the computer readable memory produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

It is to be understood that the functions/acts noted in the blocks may occur out of the order noted in the operational illustrations. For example, two blocks shown in succession may in fact be executed substantially concurrently or the blocks may sometimes be executed in the reverse order, depending upon the functionality/acts involved. Although some of the diagrams include arrows on communication paths to show a primary direction of communication, it is to be understood that communication may occur in the opposite direction to the depicted arrows.

Computer program code for carrying out operations of the concepts described herein may be written in an object oriented programming language such as Python, Java® or C++. However, the computer program code for carrying out operations of the disclosure may also be written in conventional procedural programming languages, such as the "C" programming language. The program code may execute entirely on the user's computer, partly on the user's computer, as a stand-alone software package, partly on the user's computer and partly on a remote computer or entirely on the remote computer. In the latter scenario, the remote computer may be connected to the user's computer through a local area network (LAN) or a wide area network (WAN), or the connection may be made to an external computer (for example, through the Internet using an Internet Service Provider).

Many different embodiments have been disclosed herein, in connection with the above description and the drawings. It will be understood that it would be unduly repetitious and obfuscating to literally describe and illustrate every combination and subcombination of these embodiments. Accordingly, all embodiments can be combined in any way and/or combination, and the present specification, including the drawings, shall be construed to constitute a complete written description of all combinations and subcombinations of the embodiments described herein, and of the manner and process of making and using them, and shall support claims to any such combination or subcombination.

Abbreviations that may be used in the preceding description include:

| Abbreviation | Explanation |
| --- | --- |
| AAS | Adaptive Antenna System |
| AFU | Antenna Filter Unit |
| AIR | Antenna Integrated Radio |
| CAL | Calibration |
| FIP | Form In Place Gasket |
| FU | Filter Unit |
| KRD | Top-level assembly product number consisting of a radio and antenna |
| PIM | Passive Inter-Modulation |
| RET | Remote Electric Tilt |

It will be appreciated by persons skilled in the art that the embodiments described herein are not limited to what has been particularly shown and described herein above. In addition, unless mention was made above to the contrary, it should be noted that all of the accompanying drawings are not to scale. A variety of modifications and variations are possible in light of the above teachings without departing from the scope of the following claims.

What is claimed is:

1. A radio assembly, comprising:
at least one radio including a radio board, the radio board including a plurality of radio mating elements extending from a first side of the radio board;
a plurality of filter units, each filter unit including:
a first filter mating element at a first side of the filter unit; and
at least one extended portion extending from a second side of the filter unit, each extended portion defining a filter via and a second filter mating element, the plurality of filter units being removably attached to the radio board by mating a first plurality fastening element through the plurality of filter vias and to the plurality of radio mating elements;
a plurality of clamp elements, each of the plurality of clamp elements defining a plurality of clamp vias and a plurality of retaining elements, the plurality of clamp elements being removably attached to the plurality of filter units by mating a second plurality of fastening elements through the plurality of clamp vias and to the plurality of second filter mating elements;
an antenna unit defining a plurality of antenna vias, the antenna unit being removably attached to the plurality of filter units by mating a third plurality of fastening elements through the plurality of antenna vias and to the first filter mating elements; and
a subset of the plurality of filter units remaining removably attached to the radio board while the remaining plurality of filter units remain removably attached to the antenna unit and plurality of clamp elements based on whether:

the second plurality of fastening elements are unfastened from a subset of the plurality of second filter mating elements associated with the subset of the plurality of filter units;

the third plurality of fastening elements associated with the subset of the plurality of filter units are unfastened from respective first filter mating elements; and the first plurality of fastening elements associated with the remaining plurality of filter units are unfastened from respective radio mating elements.

2. The radio assembly of claim 1, wherein each of the plurality of retaining elements is configured to retain a respective one of the first plurality of fastening elements after the respective one of the first plurality of fastening elements is unfastened from the respective radio mating element.

3. The radio assembly of claim 2, wherein the retaining element defines a snap-fit element that is configured to snap-fit onto a portion of the respective one of the first plurality of fastening elements based on the respective one of the first plurality of fastening elements being unfastened from the respective radio mating element.

4. The radio assembly of claim 3, wherein the snap-fit element extends through the clamp element.

5. The radio assembly of claim 1, wherein each clamp element includes a second plurality of retaining elements, each of the second plurality of retaining elements:

being positioned over a respective clamp via; and including a snap-fit portion positioned on one side of the clamp element.

6. The radio assembly of claim 1, wherein each second filter mating element is a threaded blind hole.

7. The radio assembly of claim 6, wherein each second filter mating element extends in an axial direction of one of the threaded blind hole and threaded through hole;

each filter via extending in the same axial direction as of the axial direction of the filter mating element.

8. The radio assembly of claim 1, wherein each of a first subset of the plurality of clamp elements define a first number clamp vias and a first number of retaining elements;

each of a second subset of the plurality of clamp elements:

define a second number clamp vias and a second number of retaining elements greater than the first number clamp vias and the first number of retaining elements; and retain a greater number of filter units than each of the first subset of the plurality of clamp elements when the plurality of clamp elements are removably attached to the filter units.

9. The radio assembly of claim 1, wherein the antenna unit includes a plurality of first alignment protrusions extending from a first side of the antenna unit; and the radio board defining a plurality of coarse alignment vias configured to receive the plurality of first alignment protrusions of the antenna unit.

10. The radio assembly of claim 9, wherein the antenna unit includes a plurality of second alignment protrusions extending from the first side of the antenna unit, each of the second alignment protrusions defining a blind hole; and the radio board including a plurality of alignment pins, each of the plurality of alignment pins configured to mate with a respective blind hole of the plurality of second alignment protrusions.

11. The radio assembly of claim 10, wherein each of the plurality of filter units includes an alignment shaft extending from the first side of the filter unit; and the antenna unit defining a plurality of slots, each of the plurality of slots configured to receive a respective alignment shaft of a filter unit.

12. The radio assembly of claim 1, wherein the antenna unit defines a plurality of access vias that provide access to the first plurality of fasteners, the second plurality of fasteners and third plurality of fasteners through the antenna unit.

13. The radio assembly of claim 12, wherein the plurality of clamp elements define a plurality of tool mating elements that are configured to mate with a plurality of lifting tools for lifting the antenna unit and the remaining of plurality of filter units while the subset of the plurality of filter units remains removably attached to the radio board; and the plurality of access vias configured to provide access to the plurality of tool mating elements.

14. A method of configuring a radio assembly, the radio assembly including at least one radio, a plurality of filter units, a plurality of clamp elements and an antenna unit, the radio including a radio board including a plurality of radio mating elements extending from a first side of the radio board, each filter unit including a first filter mating element at a first side of the filter unit and at least one extended portion extending from a second side of the filter unit, each extended portion defining a filter via and a second filter mating element, a plurality of clamp elements, each of the plurality of clamp elements defining a plurality of clamp vias and a plurality of retaining elements, an antenna unit defining a plurality of access vias, the method comprising:

removably attaching the plurality of filter units to the radio board by mating a first plurality fastening elements through the plurality of filter vias and to the plurality of radio mating elements;

removably attaching the plurality of clamp elements to the plurality of filter units by mating a second plurality of fastening elements through the plurality of clamp vias and to the plurality of second filter mating elements;

removably attaching the antenna unit to the plurality of filter units by mating a third plurality of fastening elements through the plurality of access vias and to the first filter mating elements; and determine a passive intermodulation, PIM, performance of respective interfaces between each of the plurality of filter units and the antenna unit.

15. The method of claim 14, further comprising:

determining a subset of the plurality of filter units fail to meet a PIM criterion;

detaching the subset of the plurality of filter units from the antenna unit and the plurality of clamp elements by:

unfastening the second plurality of fastening elements from a subset of the plurality of second filter mating elements associated with the subset of the plurality of filter units; and unfastening the third plurality of fastening elements associated with the subset of the plurality of filter units from respective first filter mating elements;

detaching the remaining of the plurality of filter units from the radio board by unfastening the first plurality of fastening elements associated with the remining plurality of filter units from respective radio mating elements;

removing the antenna unit from the radio assembly, the remaining plurality of filter units remaining removably attached to the antenna unit and the plurality of clamp elements while the subset of filter units remains removably attached to the radio board; and replacing the subset of filter units with other filter units while maintaining the PIM performance of respective interfaces between each of the remaining plurality of filter units and the antenna unit.

* * * * *